United States Patent
Kang et al.

(10) Patent No.: US 12,167,531 B2
(45) Date of Patent: Dec. 10, 2024

(54) FLEXIBLE PRINTED CIRCUIT BOARD HAVING WATERPROOF STRUCTURE AND FOLDABLE ELECTRONIC DEVICE INCLUDING THE SAME

(71) Applicant: SAMSUNG ELECTRONICS CO., LTD., Suwon-si (KR)

(72) Inventors: Jihoon Kang, Suwon-si (KR); Jongmin Kang, Suwon-si (KR); Chungil Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 183 days.

(21) Appl. No.: 17/879,280

(22) Filed: Aug. 2, 2022

(65) Prior Publication Data

US 2023/0043759 A1    Feb. 9, 2023

Related U.S. Application Data

(63) Continuation of application No. PCT/KR2022/010368, filed on Jul. 15, 2022.

(30) Foreign Application Priority Data

Aug. 9, 2021    (KR) .......... 10-2021-0104878
Nov. 23, 2021    (KR) .......... 10-2021-0162549

(51) Int. Cl.
*H05K 1/02* (2006.01)
*H04M 1/18* (2006.01)
(Continued)

(52) U.S. Cl.
CPC ........... *H05K 1/0298* (2013.01); *H05K 1/028* (2013.01); *H05K 5/0065* (2013.01); *H05K 5/06* (2013.01)

(58) Field of Classification Search
CPC ........ H05K 1/02; H05K 1/028; H05K 1/0281; H05K 1/0298; H05K 1/0393; H05K 1/118;
(Continued)

(56) References Cited

U.S. PATENT DOCUMENTS 10,736,211 B2    8/2020    Park et al.
11,178,779 B2    11/2021    Sim et al.
(Continued)

FOREIGN PATENT DOCUMENTS

JP    2007049076 A    2/2007
JP    2012174855 A    9/2012
(Continued)

OTHER PUBLICATIONS

International Search Report with Written Opinion issued in International Application No. PCT/KR2022/010368; International Filing Date Jul. 15, 2022; Date of Mailing Nov. 8, 2022 (8 pages).
(Continued)

*Primary Examiner* — Xiaoliang Chen
(74) *Attorney, Agent, or Firm* — CANTOR COLBURN LLP

(57) ABSTRACT

An electronic device includes a first housing having a first through-hole, of which a first opening and a second opening are communicated with each other, and a second housing connected to the first housing to be rotatable. A flexible printed circuit board (FPCB) extends from the first housing to the second housing via the first through-hole. The FPCB includes a plurality of layers, a first sealing member disposed in the first through-hole and surrounding the FPCB, and a lamination part toward the first sealing member. A portion of a first layer and/or a second layer corresponding to the second lamination part includes at least one first valley extending from a surface that faces an adjacent layer in a
(Continued)

lengthwise direction of the FPCB. The lamination part includes a first adhesive layer interposed between the first layer and the second layer and filling the at least one first valley.

14 Claims, 25 Drawing Sheets

(51) Int. Cl.
*H04M 1/22* (2006.01)
*H05K 5/00* (2006.01)
*H05K 5/06* (2006.01)

(58) Field of Classification Search
CPC ........ H05K 1/147; H05K 1/148; H05K 1/189; H05K 3/361; H05K 5/0017; H05K 5/0026; H05K 5/0065; H05K 5/0086; H05K 5/06; G06F 1/1616; G06F 1/1618; G06F 1/1641; G06F 1/1652; G06F 1/1656; G06F 1/1681; G06F 1/1683; H04M 1/022; H04M 1/0216; H04M 1/0268; H04M 1/0277; H04M 1/18
USPC .... 361/749, 757, 796, 801; 455/90.3, 550.1, 455/556.2, 575.3
See application file for complete search history.

(56) References Cited

U.S. PATENT DOCUMENTS

| | | | |
|---|---|---|---|
| 11,304,300 B2 | 4/2022 | Woo et al. | |
| 2004/0198417 A1* | 10/2004 | Yoda | H05K 1/028 455/90.3 |
| 2006/0279942 A1* | 12/2006 | Yasuda | H04M 1/0216 361/801 |
| 2007/0021159 A1* | 1/2007 | Kaneoya | H01Q 9/42 455/575.3 |
| 2010/0157548 A1* | 6/2010 | Wang | H05K 1/028 361/749 |
| 2020/0060020 A1* | 2/2020 | Park | H04M 1/0268 |
| 2020/0162596 A1* | 5/2020 | Kim | G06F 1/1616 |
| 2020/0267839 A1* | 8/2020 | Woo | H05K 5/0226 |
| 2020/0351393 A1* | 11/2020 | Kang | H04M 1/0216 |
| 2021/0247815 A1* | 8/2021 | Shim | G06F 1/1681 |
| 2022/0035410 A1* | 2/2022 | Lee | G06F 1/1681 |
| 2022/0129046 A1* | 4/2022 | Baek | G06F 1/1683 |
| 2022/0232704 A1 | 7/2022 | Woo et al. | |

FOREIGN PATENT DOCUMENTS

| | | |
|---|---|---|
| KR | 20060071914 A | 6/2006 |
| KR | 101335272 B1 | 11/2013 |
| KR | 20150034460 A | 4/2015 |
| KR | 20160139829 A | 12/2016 |
| KR | 20190076231 A | 7/2017 |
| KR | 20200021172 A | 2/2020 |
| KR | 20200057236 A | 5/2020 |
| KR | 20200101201 A | 8/2020 |
| KR | 20210050040 A | 5/2021 |

OTHER PUBLICATIONS

Extended European Search Report corresponding to Application No. 22856040.5-1218; Dated Aug. 20, 2024.

* cited by examiner

FLEXIBLE PRINTED CIRCUIT BOARD HAVING WATERPROOF STRUCTURE AND FOLDABLE ELECTRONIC DEVICE INCLUDING THE SAME

CROSS-REFERENCE TO RELATED APPLICATION(S)

This application is a continuation application, claiming priority under § 365(c), of an International Application No. PCT/KR2022/010368, filed on Jul. 15, 2022, which is based on and claims the benefit of a Korean patent application number 10-2021-0162549, filed on Nov. 23, 2021, and Korean Patent Application No. 10-2021-0104878 filed on Aug. 9, 2021, in the Korean Intellectual Property Office, the disclosure of which is incorporated by reference herein in its entirety.

TECHNICAL FIELD

Embodiments of the present disclosure relate to a flexible printed circuit board having a waterproof structure, and a foldable electronic device including the same.

BACKGROUND

A foldable electronic device may include a first housing, a second housing, and a hinge structure disposed between the first housing and the second housing. The hinge structure may be connected to the first housing and the second housing to support a folding operation of the foldable electronic device. To connect electronic components disposed in interiors of the first housing and the second housing, a connection member that extends from the first housing to the second housing over the hinge structure may be required.

The connection member, for example, may include a flexible printed circuit board (hereinafter, referred to as an FPCB) that may be curved at least partially.

DISCLOSURE

Technical Problem

The FPCB may include a plurality of layers. When curving or deforming the FPCB in the first housing and/or the second housing, the plurality of layers may be separated from each other.

Foreign substances, such as moisture or dust, may be introduced between one or more of separated layers. To prevent the introduction of foreign substances, the plurality of layers may be laminated on each other. However, laminating the layers makes it is difficult to achieve a required flexibility while also increasing the thicknesses of the FPCB and the electronic device.

In other instances, the plurality of layers may be laminated on each other only in some sections with the aim of preventing the introduction of foreign substances, However, when the plurality of layers are separated from each other to be curved or bending some sections, the plurality of layers may become permanently deformed, whereby a required shape of the FPCB may not be maintained.

Technical Solution

Various embodiments of the disclosure provide an FPCB that can prevent introduction of foreign substances and secure a required shape through a stepped lamination structure, and an electronic device including the same. According to an embodiment of the present disclosure, an electronic device includes a first housing having a first through-hole, of which a first opening and a second opening are communicated with each other, and a second housing connected to the first housing to be rotatable. A flexible printed circuit board extends from the first housing to the second housing via the first through-hole and includes a plurality of layers. A first sealing member is disposed in the first through-hole and surrounds the FPCB. The FPCB includes a first lamination part extending in the first housing in a direction that is different from an extension direction of the first through-hole includes a part, in which the plurality of layers are at least partially laminated on each other, a first curved part extending from the first lamination part to pass through the first opening, and including a part, in which the plurality of layers are separated from each other. A second lamination part extends from the first curved part toward the first sealing member, and a second curved part extends from the second lamination part toward the second housing via the second opening. The plurality of layers include a first layer and a second layer. A portion of the first layer and/or the second layer corresponds to the second lamination part and includes at least one first valley extending from a surface that faces an adjacent layer in a lengthwise direction of the FPCB. The second lamination part includes a first adhesive layer interposed between the first layer and the second layer to be filled in the at least one first valley.

According to an embodiment of the present disclosure, a foldable electronic device includes a first housing including a first through-hole, of which a first opening and a second opening are communicated with each other, and a second housing connected to the first housing to be rotatable. A flexible printed circuit board extends from the first housing to the second housing via the first through-hole and including a plurality of layers. A first sealing member is disposed in the first through-hole to surround the FPCB, and provides an elastic force in a direction that faces an inner wall of the first through-hole and a direction that faces the FPCB. A first waterproof member is located in the first through-hole and is formed on the first sealing member to surround the FPCB. The FPCB further includes a first curved part extending from an outside of the first through-hole to an interior of the first through-hole via the first opening, wherein the first curved part includes a section curved from a first point on an outer side of the first opening to a second point in an interior of the first through-hole. A first lamination part includes a first section extending from the first curved part, and a second section extending from the first section toward the first sealing member. The plurality of layers include a first layer, a second layer laminated on the first layer, and a third layer laminated on the second layer. The first layer includes at least one first valley formed on a surface that faces the second layer, and the second layer includes at least one second valley formed on a surface that faces the third layer. The first lamination part includes a first adhesive layer interposed between the first layer and the second layer to be filled in the at least one first valley, and a second adhesive layer interposed between the second layer and the third layer to be filled in the at least one second valley. A portion of the second adhesive layer corresponding to the first section has an extend that is smaller than that of the first adhesive layer by a first area. The first area is defined based on a central angle formed by the first point and the second point with respect to a curvature center of the curved section of the first curved part, and a spacing distance between the second layer and the third layer.

Advantageous Effects

The electronic device according to an embodiment of the disclosure can maintain the shape of the curving part of the FPCB through the stepped lamination structure.

The FPCB according to an embodiment of the disclosure can satisfy a required shape of a curving part of the FPCB by laminating the plurality of layers at different areas.

The electronic device according to an embodiment can prevent foreign substances from being introduced between the layers of the FPCB, through the stepped lamination structure.

The FPCB according to an embodiment of the disclosure can prevent foreign substances that may be introduced between the layers of the FPCB by laminating the layers such that the valleys formed between the layers are filled.

The FPCB according to an embodiment of the disclosure can also satisfy a required waterproof/dustproof performance using the stepped lamination structure without increasing a total thickness of the FPCB.

In addition, the disclosure may provide various effects that are directly or indirectly recognized.

DESCRIPTION OF DRAWINGS

With regard to description of drawings, the same or similar components may be marked by the same or similar reference numerals.

MODE FOR INVENTION

Hereinafter, various embodiments of the disclosure will be described with reference to the accompanying drawings. Accordingly, those of ordinary skill in the art will recognize that modification, equivalent, and/or alternative on the various embodiments described herein can be variously made without departing from the scope and spirit of the disclosure.

Figure 1:
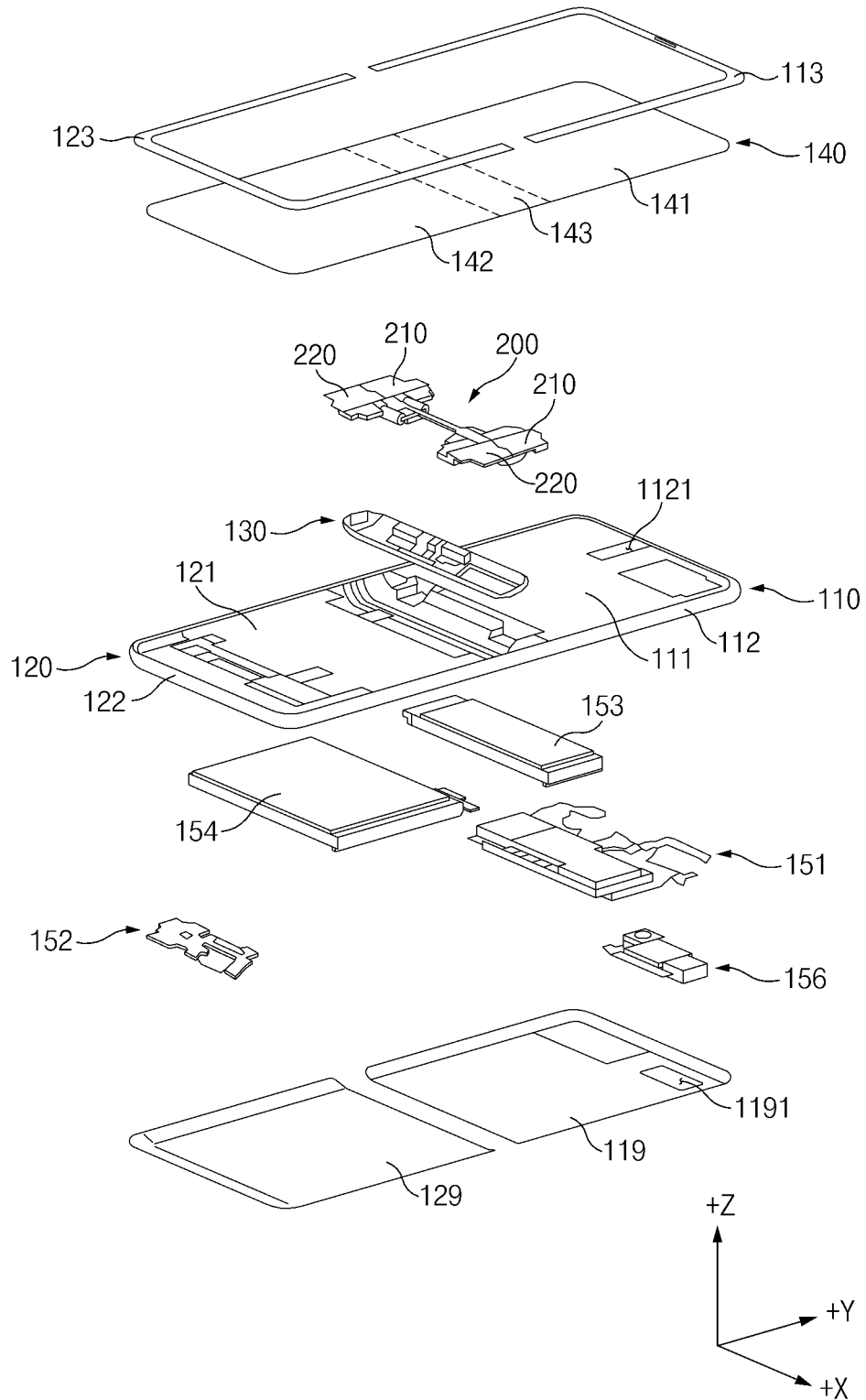
FIG. 1 is an exploded perspective view of an electronic device according to an embodiment.

FIG. 1 is an exploded perspective view of an electronic device according to an embodiment.

Referring to FIG. 1, an electronic device 100 (e.g., the electronic device 1001 of FIG. 10) according to an embodiment may include a first housing 110, a second housing 120, a hinge housing 130, a hinge structure 200, and a display 140.

In an embodiment, the first housing 110 may be connected to the second housing 120 by using the hinge structure 200. In an embodiment, the first housing 110 may include a first support member 111, on which the display 140 is seated, and a first frame 112 that surrounds at least a portion of the first support member 111. In an embodiment, the first frame 112 of the first housing 110 may define a portion of a surface (e.g., a side surface) of the electronic device 100. In an embodiment, the first frame 112 and the first support member 111 may be connected (or coupled) to each other. In an embodiment, the display 140 may be disposed in the first support member 111. For example, a first area 141 and a folding area 143 of the display 140 may be at least partially disposed in the first support member 111 of the first housing 110. In an embodiment, an area of the first support member 111, in which the display 140 is disposed, may be formed to be substantially flat, but the disclosure is not limited thereto. In an embodiment, at least a portion of the first housing 110 may be bonded to the display 140. For example, the first support member 111 of the first housing 110 may be bonded to the first area 141 of the display 140. Furthermore, at least a portion of a periphery of the front surface of the first housing 110 may be bonded to a periphery of the first area 141 of the display 140. In this regard, the electronic device 100 according to an embodiment may include an adhesive layer (not illustrated) interposed between the first housing 110 and the display 140 to bond them together.

In an embodiment, a first rotation structure 210 of the hinge structure 200 may be connected to the first support member 111. In an embodiment, the first housing 110 connected to the first rotation structure 210 may be rotated about the hinge structure 200.

In an embodiment, the first housing 110 may include a first decoration member 113 that surrounds a periphery of the display 140, and a first rear plate (or a first rear cover)

119 that defines a surface of the electronic device 100 while facing the first support member 111. For example, the first decoration member 113 may be disposed to cover a periphery of the first area 141 and at least a portion of the folding area 143 of the display 140. For example, the first rear plate 119 may define a rear surface of the electronic device 100 in a flat state (e.g., FIG. 2A), and the display 140 may define a front surface of the electronic device.

In an embodiment, the second housing 120 may be connected to the first housing 110 through the hinge structure 200. In an embodiment, the second housing 120 may include a second support member 121, on which the display 140 is seated, and a second frame 122 that surrounds at least a portion of the second support member 121. In an embodiment, the second frame 122 may define a portion of a surface (e.g., a side surface) of the electronic device 100. In an embodiment, the second support member 121 may be connected to the second frame 122. In an embodiment, the display 140 may be disposed in the second support member 121. For example, a second area 142 and the folding area 143 of the display 140 may be at least partially disposed in the second support member 121. In an embodiment, an area of the second support member 121, in which the display 140 is disposed, may be formed to be substantially flat, but the disclosure is not limited thereto. In an embodiment, at least a portion of the second housing 120 may be bonded to the display 140. For example, the second support member 121 of the second housing 120 may be bonded to the second area 142 of the display 140. Furthermore, at least a portion of a periphery of the front surface of the second housing 120 may be bonded to a periphery of the second area 142 of the display 140. In this regard, the electronic device 100 according to an embodiment may include an adhesive layer (not illustrated) interposed between the second housing 120 and the display 140 to bond them together.

In an embodiment, a second rotation structure 220 of the hinge structure 200 may be connected to the second support member 121 of the second housing 120. In an embodiment, the second housing 120 connected to the second rotation structure 220 may be rotated about the hinge structure 200.

In an embodiment, the second housing 120 may include a second decoration member 123 that surrounds a periphery of the display 140, and a second rear plate (or a second rear cover) 129 that defines a surface of the electronic device 100 while facing the second support member 121. For example, the second decoration member 123 may be disposed to cover a periphery of the second area 142 and at least a portion of the folding area 143 of the display 140. For example, the second rear plate 129 may define the rear surface of the electronic device 100 in the flat state (e.g., FIG. 2A), and the display 140 may define the front surface of the electronic device.

In an embodiment, the first housing 110 and/or the second housing 120 may include a metallic material, a nonmetallic material (e.g., a resin), or a combination of a metallic material a nonmetallic material. For example, at least a portion of the first housing 110 and/or the second housing 120 may be formed of a metallic material, or may be formed of a nonmetallic material. The first housing 110 and the second housing 120 may be formed of a material having a specific strength to support at least a portion of the display 140. In an embodiment, a part, in which the first housing 110 and the second housing 120 face each other, may include a part that is depressed such that at least a portion thereof has a specific curvature, and through this, the first housing 110 and the second housing 120 may define a space, in which the hinge housing 130 is accommodated, together. In an embodiment, the hinge housing 130 may be at least partially disposed in the space defined by the first housing 110 and the second housing 120 together. In an embodiment, the hinge housing 130 disposed in the space may be exposed to an outside or be at least partially covered by the first housing 110 and the second housing 120 according to the folded state of the electronic device 100. In an embodiment, the hinge housing 130 may have a shape that extends long in the X axis direction as a whole. A structure (e.g., a boss structure or a "hinge fixture") for fixing the hinge structure 200 may be disposed in a partial area of an inner surface of the hinge housing 130.

The electronic device 100 according to an embodiment may include a lattice structure (not illustrated) and/or a bracket (not illustrated) disposed on a lower side (e.g., the −Z axis direction) of the display 140. The lattice structure and/or the bracket may be interposed between the display 140, and the first and second housings 110 and 120. For example, the lattice structure and/or the bracket may be interposed between one or more adhesive layers for attaching the display 140 to the first and second housings 110 and 120, and the display 140. The lattice structure (or the bracket) may include an area that at least partially overlaps the folding area 143. A plurality of slits may be formed in the area that overlaps the folding area 143. The plurality of slits may extend along an extension direction (e.g., the X axis direction) of the folding area 143, respectively. The plurality of slits may support the folding area 143 that is a flat surface in the flat state (e.g., FIG. 2A), and may help the folding area 143 to be deformed in a folding operation or an unfolding operation.

In an embodiment, a first printed circuit board 151, a first battery 153, and a camera module 156 may be disposed in an interior of the first housing 110. For example, the display 140 may be disposed on one side (e.g., the +Z axis direction) of the first support member 111, and the first printed circuit board 151, the first battery 153, and the camera module 156 (e.g., a camera module 1080 of FIG. 10) may be disposed in an opposite side (e.g., the −Z axis direction) of the first support member 111. In an embodiment, at least one recess, in which the first printed circuit board 151, the first battery 153, and the camera module 156 are seated, may be formed on the opposite side of the first support member 111. In an embodiment, the camera module 156 may be disposed on the opposite side of the first support member 111 to be adjacent to the first frame 112.

In an embodiment, the camera module 156 may include at least one camera. For example, the camera module 156 may include a first camera disposed to face the forward direction and/or a second camera disposed to face the rearward direction to acquire an image corresponding to the forward direction (e.g., the +Z axis direction) and/or the rearward direction (e.g., the −Z axis direction) of the electronic device 100. In an embodiment, a hole 1121 that overlaps the first camera may be formed in the first support member 111, and the first camera may acquire an image corresponding to the front surface through the hole 1121. In an embodiment, a partial area 1191 of the first rear plate 119 that overlaps the second camera may be substantially transparent, and the second camera may acquire an image corresponding to the rear surface through the partial area 1191 of the first rear plate 119.

In an embodiment, a second printed circuit board 152 and a second battery 154 may be disposed in an interior of the second housing 120. For example, the display 140 may be disposed on one side (e.g., the +Z axis direction) of the second rear plate 129 of the second housing 120, and the second printed circuit board 152 and the second battery 154 may be disposed on the opposite side (e.g., the −Z axis direction) of the second rear plate 129.

In an embodiment, the first printed circuit board 151 and the second printed circuit board 152 may be electrically or operatively connected to each other through an FPCB (or a rigid-flexible printed circuit board) (not illustrated) (e.g., a FPCB 30 of FIG. 3A) that extends from the first housing 110 to the second housing 120 over the hinge structure 200.

In an embodiment, at least one of the first battery 153, the camera module 156, and/or the second battery 154 may be electrically connected to the first printed circuit board 151 and/or the second printed circuit board 152 through the FPCB or a separate FPCB distinguished therefrom.

In an embodiment, a processor (e.g., a processor 1020 of FIG. 10), a memory (e.g., a memory 1030 of FIG. 10), and/or an interface (e.g., an interface 1077 of FIG. 10) may be disposed in the first printed circuit board 151 and/or the second printed circuit board 152. The processor, for example, may include one or more of a central processing unit, an application processor, a graphic processing unit, an image signal processor, a sensor hub processor, or a communication processor. The memory, for example, may include a volatile and/or nonvolatile memory. The interface, for example, may include a high definition multimedia interface (HDMI), a universal serial bus (USB), an SD card interface, and/or an audio interface. The interface, for example, may electrically or physically connect the electronic device 100 to an external electronic device, and may include a USB connector, an SD card/MMC connector, and an audio connector.

In an embodiment, the first and second batteries 153 and 154 (e.g., a battery 1089 of FIG. 10) may store electric power that is necessary for at least one element of the electronic device 100. For example, the first and second batteries 153 and 154 may include a rechargeable secondary battery or a fuel cell. In an embodiment, at least a portion of the first battery 153 and/or the second battery 154 may be disposed on substantially the same plane as that of those of the first printed circuit board 151 and/or the second printed circuit board 152, but the disclosure is not limited thereto.

In an embodiment, at least a portion of the display 140 may be flexible. For example, the display 140 may include the first area 141 disposed on the first housing 110, the second area 142 disposed on the second housing 120, and the folding area 143 located between the first area 141 and the second area 142. In an embodiment, the folding area 143 may extend from the first area 141 to the second area 142. In an embodiment, the first area 141 and the second area 142 may be substantially flat, and the folding area 143 may be formed to be deformed to a flat surface or a curved surface.

According to an embodiment, the hinge structure 200 may include the first rotation structure 210 connected to the first housing 110, and the second rotation structure 220 connected to the second housing 120. The hinge structure 200 may be configured such that the first rotation structure 210 and the second rotation structure 220 is rotatable about rotation axes (e.g., imaginary axes that are parallel to the X axis direction) thereof. For example, when the first housing 110 and the second housing 120 are folded or unfolded, the first rotation structure 210 and the second rotation structure 220 may be rotated about the rotation axes thereof.

Figure 2A:
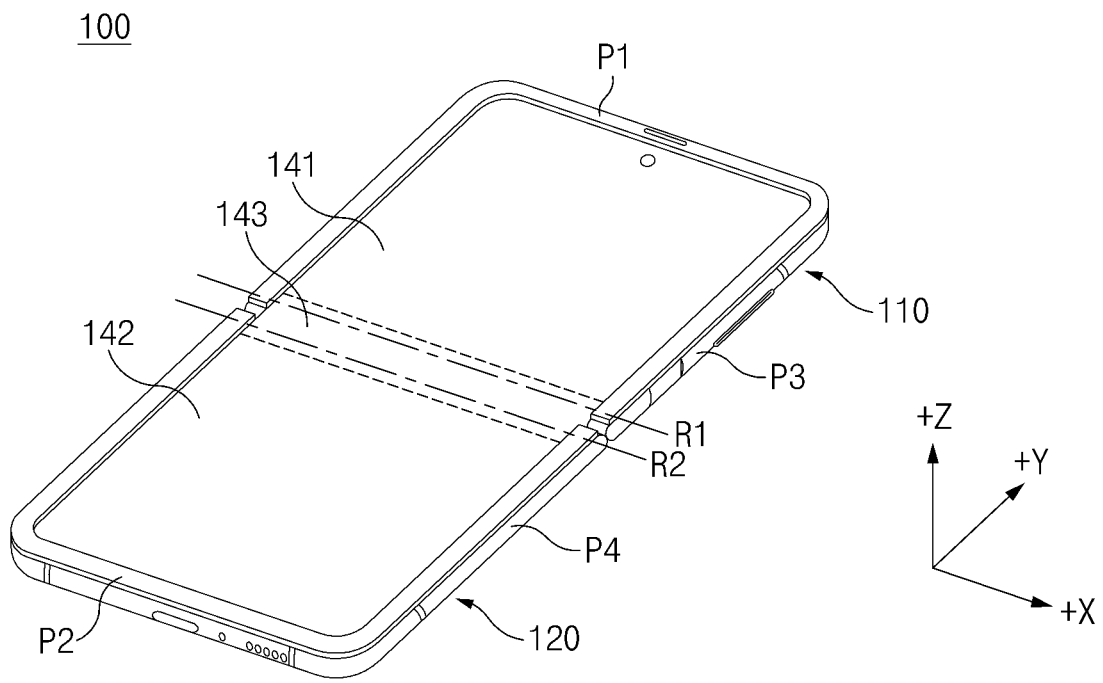
FIG. 2A is a view illustrating a flat state of an electronic device according to an embodiment.
Figure 2A:
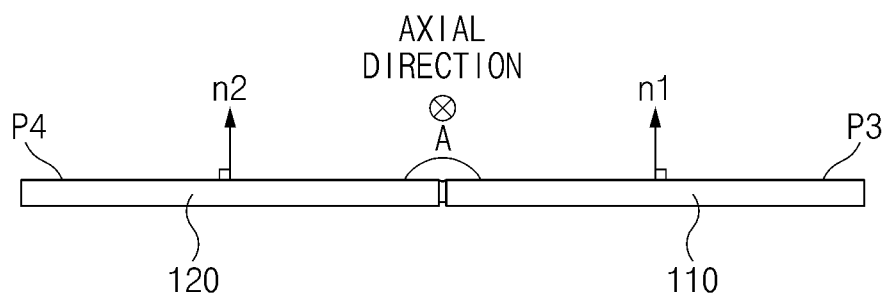
Figure 2B:
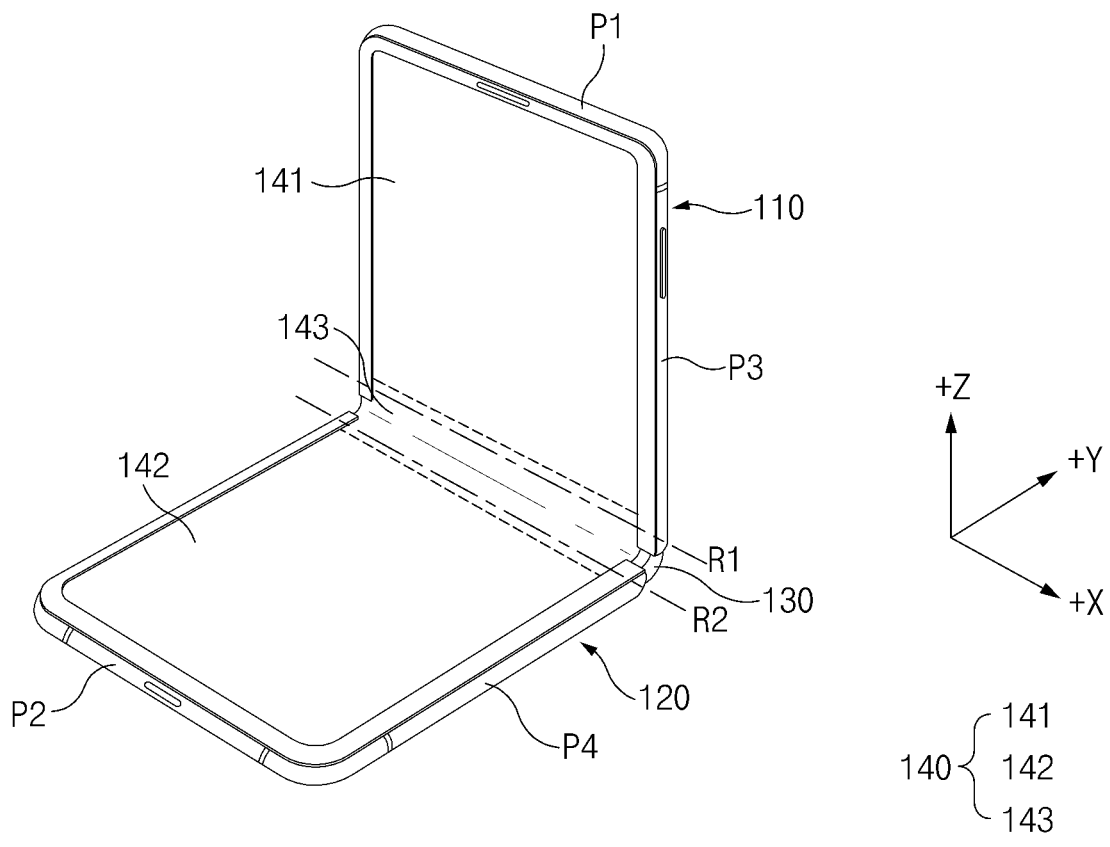
FIG. 2B is a view illustrating a folded state of an electronic device according to an embodiment.
Figure 2B:
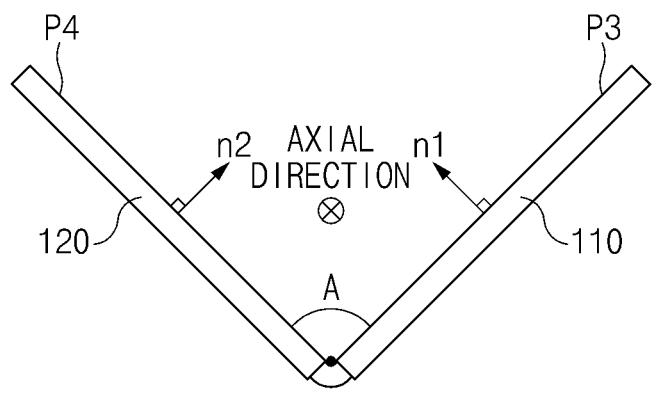
Figure 2C:
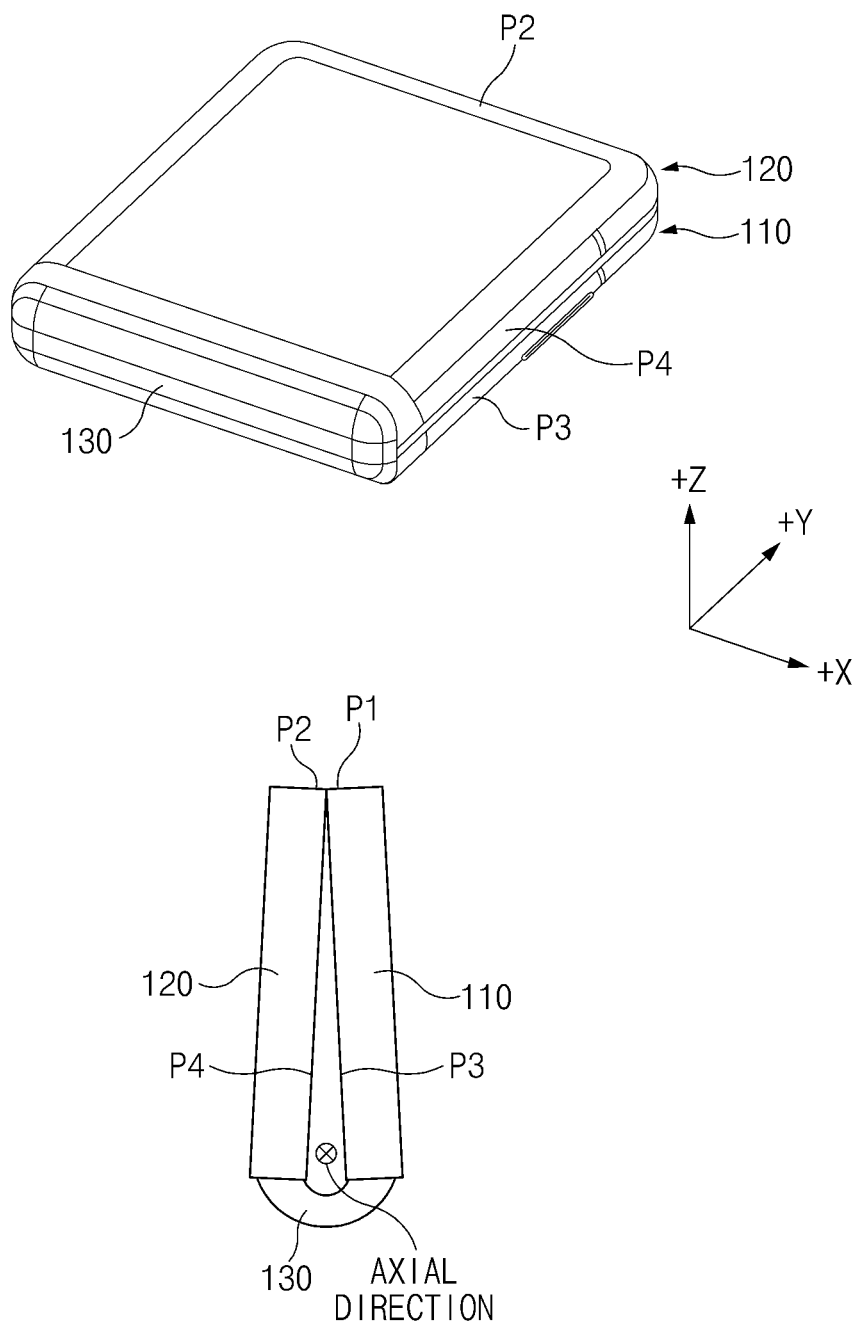
FIG. 2C is a view illustrating a fully folded state of an electronic device according to an embodiment.

FIG. 2A is a view illustrating a flat state of an electronic device according to an embodiment. FIG. 2B is a view illustrating a folded state of an electronic device according to an embodiment. FIG. 2C is a view illustrating a fully folded state of an electronic device according to an embodiment.

Referring to FIGS. 2A, 2B, and 2C, in an embodiment, the first housing 110 and the second housing 120 may be rotated about the rotation axes thereof. For example, the first housing 110 may be rotated about a first rotation axis R1 provided by the first rotation structure (e.g., the first rotation structure 210 of FIG. 1) of the hinge structure (e.g., the hinge structure 200 of FIG. 1), and the second housing 120 may be rotated (e.g., pivoted) about a second rotation axis R2 provided by the second rotation structure (e.g., the second rotation structure 220 of FIG. 1) of the hinge structure 200. In an embodiment, the first housing 110 and the second housing 120 may be rotated in opposite directions about the rotation axes R1 and R2 thereof, respectively. For example, in a folding operation from the flat state (e.g., FIG. 2A), the first housing 110 may be rotated in a counterclockwise direction about the first rotation axis R1, and the second housing 120 may be rotated in a clockwise direction about the second rotation axis R2.

In an embodiment, an axial direction that is parallel to the rotation axes R1 and R2 of the first housing 110 and the second housing 120 may be defined. For example, the axial direction may be defined as an extension direction of the folding area 143 of the display 140. In another example, the axial direction may be defined as a long edge direction of the folding area 143. As another example, the axial direction may mean a direction that is parallel to the X axis of FIG. 1.

To describe states of the electronic device according to various embodiments of the disclosure, a first periphery P1 of the electronic device 100 and a second periphery P2 of the electronic device 100 that are parallel to the axial direction may be defined. To describe the states of the electronic device 100, a third periphery P3 of the electronic device 100 and a fourth periphery P4 of the electronic device 100 that are perpendicular to the axial direction may be defined. For example, the first periphery P1 and the third periphery P3 may include a portion of the first frame (e.g., the first frame 112 of FIG. 1) of the first housing 110. For example, the second periphery P2 and the fourth periphery P4 may include a portion of the second frame (e.g., the second frame 122 of FIG. 1) of the second housing 120.

The flat state of the electronic device will be described with reference to FIG. 2A. For example, the flat state of the electronic device 100 may include a state, in which the folding area 143 of the display 140 is substantially flat surface. For example, the flat state may include a state, in which the first area 141 and the second area 142 of the display 140 are flat surfaces that face the same direction. As another example, the flat state may include a state, in which the first area 141 and the second area 142 of the display 140 form one substantially flat surface. For example, the flat state may include a state, in which a first normal vector n1 of the first area 141 of the display 140 and a second normal vector n2 of the second area 142 are parallel to each other. For example, the flat state may include a state, in which the third periphery P3 and the fourth periphery P4 form one substantially straight line. For example, the flat state may include a state, in which the third periphery P3 and the fourth periphery P4 form 180 degrees.

The folded state of the electronic device will be described with reference to FIG. 2B. For example, the folded state may include a state, in which at least a portion of the folding area 143 of the display 140 is curved. For example, the folded state may include a state, in which the first normal vector n1 of the first area 141 and the second normal vector n2 of the second area 142 form a specific angle other than 180 degrees. For example, the folded state may include a state, in which the third periphery P3 and the fourth periphery P4 form the specific angle other than 180 degrees.

The fully folded state of the electronic device will be described with reference to FIG. 2C. For example, the fully folded state may mean a state of the folded state, in which the first periphery P1 and the second periphery P2 substantially contact each other. For example, the folding area 143 in the fully folded state may include a curved surface having a curvature that is larger than that of the folding area 143 in the folded state.

Referring to FIG. 2C, in the fully folded state, at least a portion of the hinge housing 130 may define a surface of the electronic device 100. For example, the hinge housing 130 may be visually exposed through a space between the first housing 110 and the second housing 120. Although not illustrated, in the folded state of FIG. 2B, an area, by which the hinge housing 130 is exposed to an outside, may be smaller than that in the fully folded state. Although not illustrated, in the flat state of FIG. 2A, the hinge housing 130 may be covered by the first housing 110 and the second housing 120 so as not to be viewed, the disclosure is not limited thereto.

Figure 3A:
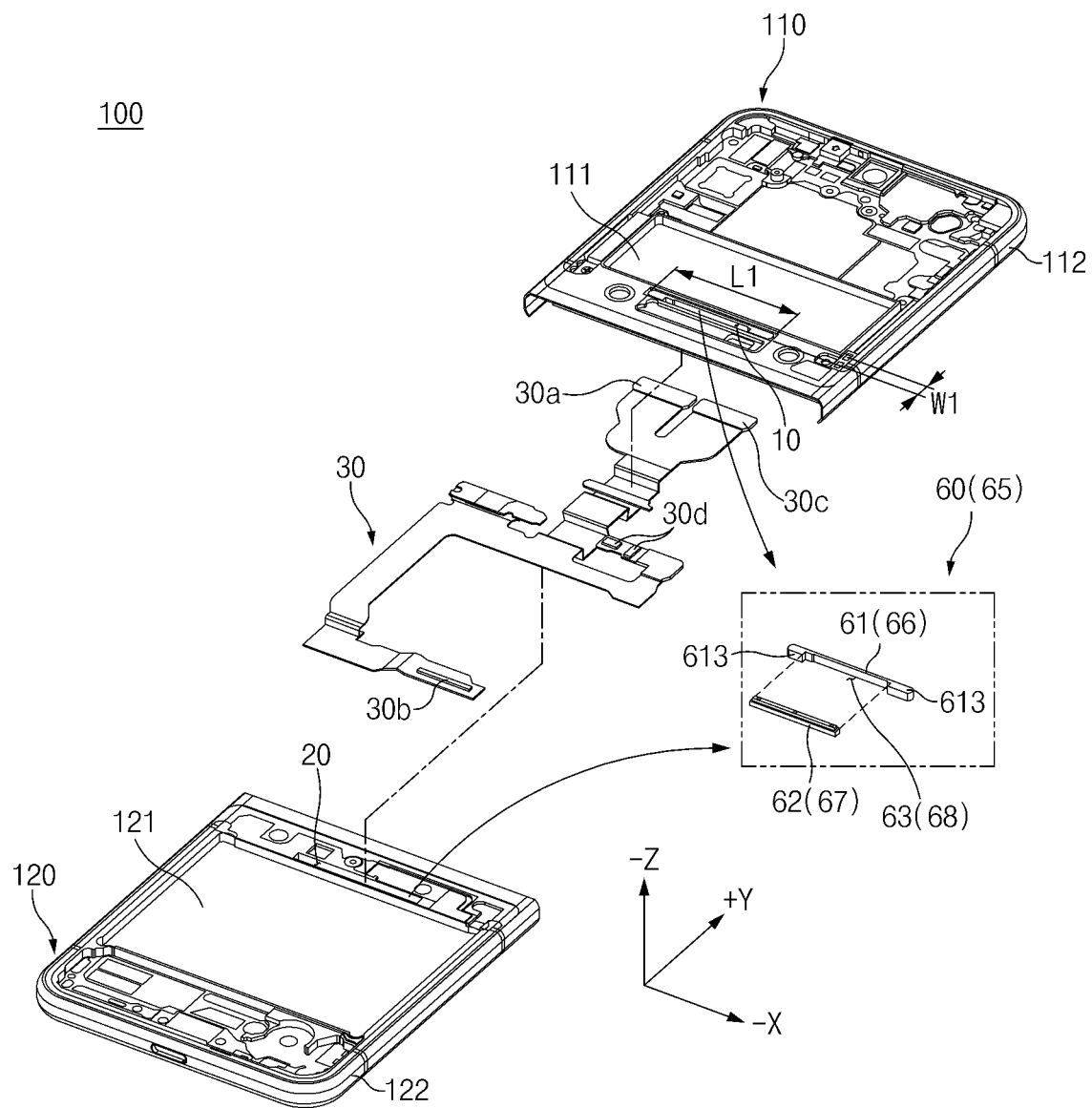
FIG. 3A is an exploded perspective view of an electronic device according to an embodiment.

FIG. 3A is an exploded perspective view of an electronic device according to an embodiment.

Figure 3B:
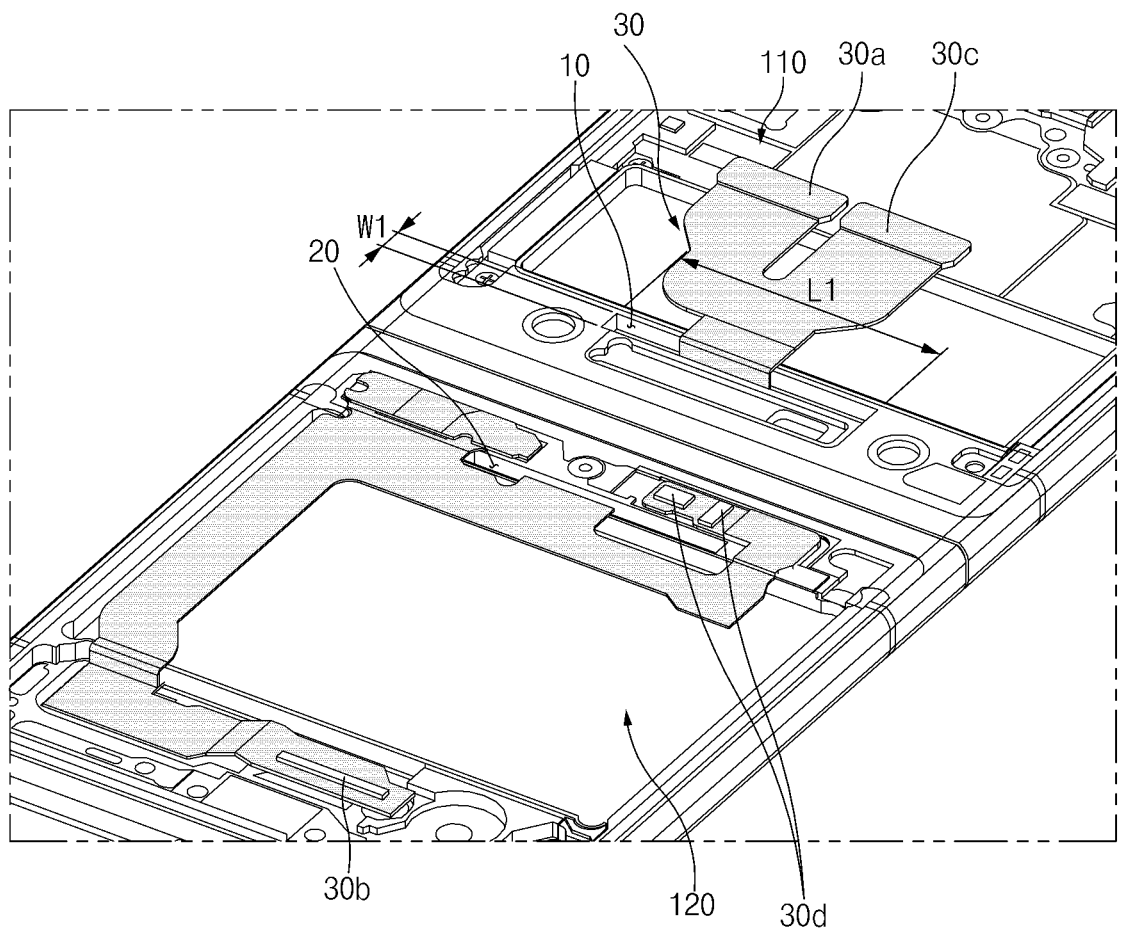
FIG. 3B is a partially perspective view of an electronic device according to an embodiment.
Figure 3B:
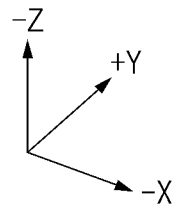

FIG. 3B is a partially perspective view of an electronic device according to an embodiment. FIG. 3B may be a view illustrating that the components of the electronic device illustrated in FIG. 3A are coupled to each other.

Figure 3C:
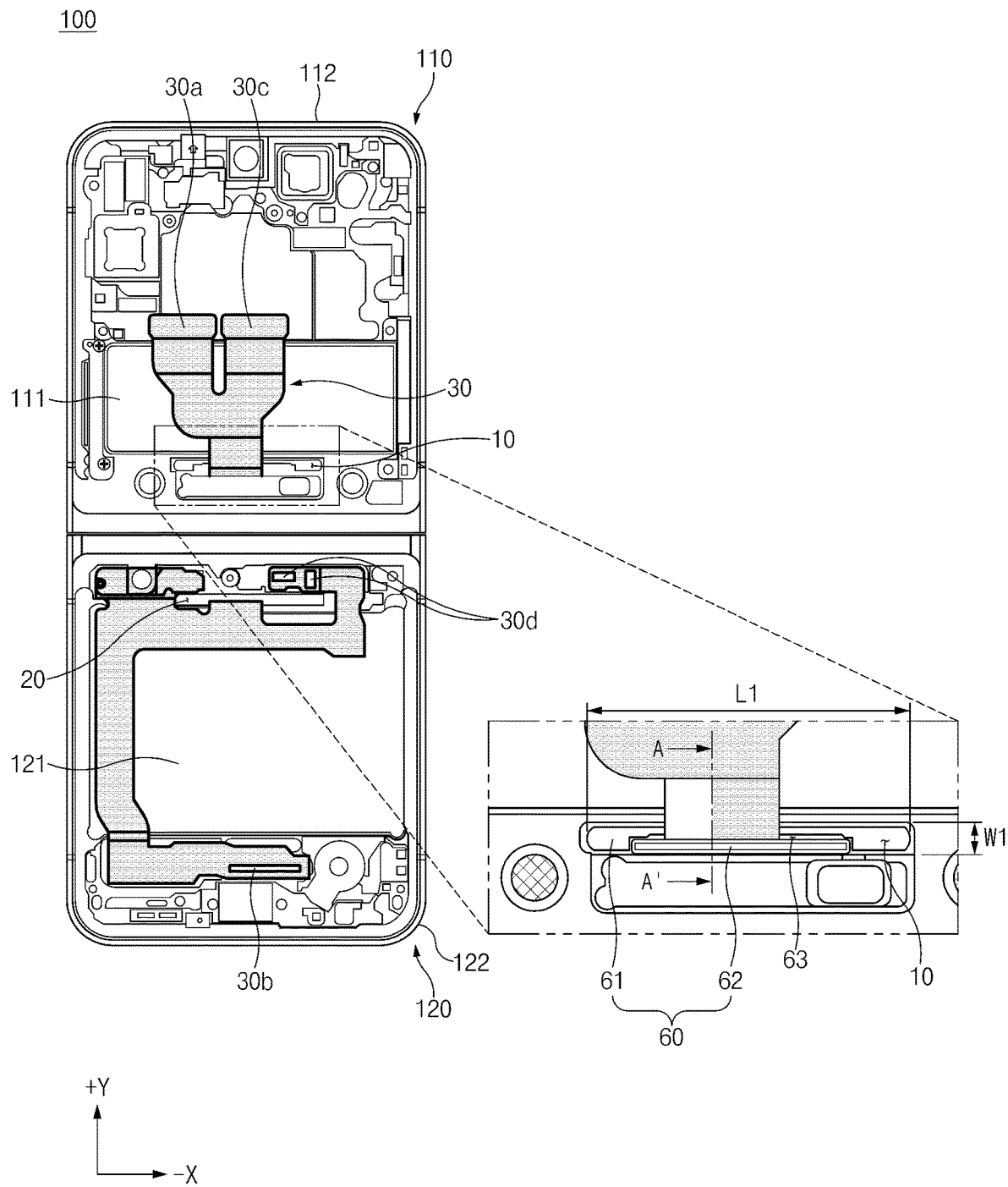
FIG. 3C is a plan view of an electronic device according to an embodiment.

FIG. 3C is a plan view of an electronic device according to an embodiment. FIG. 3C may be a view illustrating that the components of the electronic device illustrated in FIG. 3A are coupled to each other.

Figure 3D:
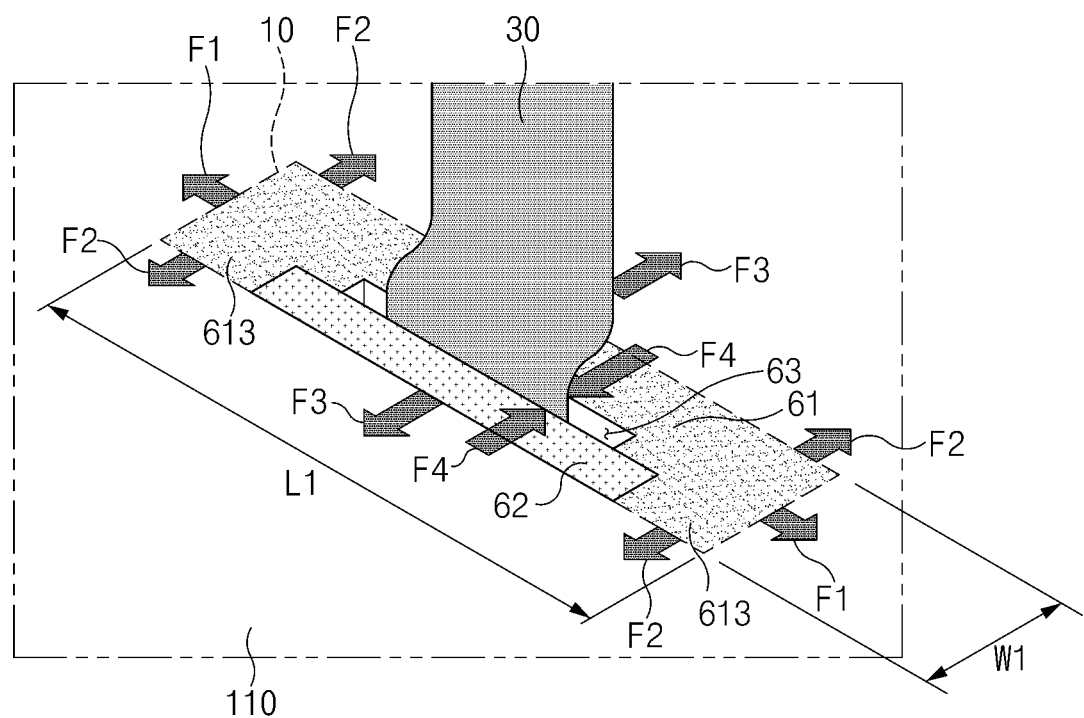
FIG. 3D is a view illustrating a first waterproof member and an FPCB disposed in a through-hole according to an embodiment.

FIG. 3D is a view illustrating a first waterproof member and an FPCB disposed in a through-hole according to an embodiment.

Hereinafter, a repeated description of configurations having the same reference numerals as the above-described configurations will be omitted.

Referring to FIGS. 3A, 3B, and 3C, in an embodiment, a first through-hole 10 may be formed in the first housing 110. For example, the first through-hole 10 may be formed in the first support member 111 of the first housing 110. In an embodiment, the first through-hole 10 may extend by a first length L1 with a first width W1. In an embodiment, the first length L1 of the first through-hole 10 may mean a length of the first through-hole 10 with respect to a first direction (e.g., the X axis direction). In an embodiment, the first width W1 of the first through-hole 10 may mean a length of the first through-hole 10 with respect to a second direction (e.g., the Y axis direction) that is different (e.g., orthogonal) from the first direction. In an embodiment, the first through-hole 10 may pass through the first support member 111 of the first housing 110 in a third direction (e.g., the Z axis direction) that is different (e.g., orthogonal) from the first direction and the second direction.

In an embodiment, a second through-hole 20 may be formed in the second housing 120. For example, the second through-hole 20 may be formed in the second support member 121 of the second housing 120. In an embodiment, similar to the first through-hole 10, the second through-hole 20 may extend by a second length with a second width. In an embodiment, the second through-hole 20 may pass through the second support member 121 of the second housing 120 in a fourth direction (e.g., the Z axis direction) that is different (e.g., orthogonal) from the first direction and the second direction. In an embodiment, the second length and/or the second width of the second through-hole 20 may be substantially the same as the first length L1 and the first width W1 of the first through-hole 10, but the disclosure is not limited thereto. In an embodiment, the fourth direction of the second through-hole 20 that passes through the second support member 121 may be substantially the same as the third direction of the first through-hole 10, but the disclosure is not limited thereto.

The electronic device 100 according to an embodiment may include the flexible printed circuit board (FPCB) 30 and a first sealing member 60.

In an embodiment, the FPCB 30 may extend from the first housing 110 to the second housing 120. In an embodiment, the FPCB 30 may extend from the first housing 110 to the second housing 120 over the hinge structure (e.g., the hinge structure 200 of FIG. 1) disposed between the first housing 110 and the second housing 120. In an embodiment, the FPCB 30 may extend from the first housing 110 to the second housing 120 over the folding area (e.g., the folding area 143 of the display 140 of FIG. 1) of the display.

In an embodiment, the FPCB 30 may extend from the first housing 110 to the second housing 120 via the first through-hole 10 and the second through-hole 20. For example, the FPCB 30 may pass through the first through-hole 10 and the second through-hole 20 in a sequence thereof while extending from the first housing 110 to the second housing 120.

In an embodiment, the FPCB 30 may electrically connect the first printed circuit board (e.g., the first printed circuit board 151 of FIG. 1) disposed in the first housing 110, and the second printed circuit board (e.g., the second printed circuit board 152 of FIG. 1) disposed in the second housing 120. For example, the FPCB 30 may include a first connector part (or a first connector portion) 30a located in the first housing 110 and connected to the first printed circuit board, and a second connector part (or a second connector portion) 30b located in the second housing 120 and connected to the second printed circuit board. In an embodiment, through the FPCB 30, elements (e.g., a processor 1020 of FIG. 10) disposed in the first printed circuit board, and elements (e.g., a connecting terminal 1078 of FIG. 10 or a sound output module 1055) connected to the second printed circuit board may be operatively or electrically connected to each other.

In an embodiment, the FPCB 30 may operatively or electrically connect an element of the electronic device 100 disposed in the first printed circuit board to other elements. For example, the FPCB 30 may include a third connector part (or a third connector portion) 30c located in the first housing 110 and connected to the first printed circuit board, and a fourth connector part (or a fourth connector portion) 30d electrically connected to the other elements. For example, a battery (e.g., the second battery 154 of FIG. 1) of the electronic device 100 may be connected to the fourth connector part 30d, and the battery may be operatively or electrically connected to a processor (e.g., the processor 1020 of FIG. 10) and/or a power management module (e.g., a power management module 1088 of FIG. 10) of the electronic device 100 through the FPCB 30. As another example, an antenna module (e.g., an antenna module 1097 of FIG. 10) for near field communication (NFC) and/or wireless charging may be connected to the fourth connector part 30d, and the antenna module may be operatively or electrically connected to the processor and/or the wireless communication module (e.g., a wireless communication module 1092 of FIG. 10) of the electronic device 100 through the FPCB 30.

In an embodiment, the first sealing member 60 may be disposed in the first through-hole 10 to form a waterproof structure for the first through-hole 10. In an embodiment, the waterproof structure of the electronic device 100 may include at least the first sealing member 60. For example, the waterproof structure of the electronic device 100 may include the first sealing member 60, a first waterproof member 81, which will be described below, and a stepped lamination structure of the FPCB 30, which will be described below.

In an embodiment, the waterproof structure of the electronic device 100 may prevent foreign substances from being introduced through the first through-hole 10. However, the waterproof structure is not limited to the purpose of interrupting or blocking only 'moisture' in spite of the name of the 'waterproof' structure. For example, the waterproof of the electronic device 100 may interrupt or block external foreign substances, such as dust, as well as moisture.

Referring to FIGS. 3A and 3D, in an embodiment, the first sealing member 60 may at least partially close the first through-hole 10. In an embodiment, the first sealing member 60 may include a first member 61 and a second member 62. In an embodiment, the first member 61 may extend long along a first lengthwise direction L1 of the first through-hole 10. In an embodiment, the first member 61 may include stepped parts 613 formed at opposite ends thereof. In an embodiment, the second member 62 may be coupled to the first member 61.

In an embodiment, the first sealing member 60 may include a first accommodation hole 63 formed between the first member 61 and the second member 62. In an embodiment, the FPCB 30 may pass through the first accommodation hole 63 formed in the first sealing member 60.

In an embodiment, the first member 61 may be formed to be longer than the first length L1 of the first through-hole 10. In this case, the first member 61 may be pressed while being disposed in the first through-hole 10. For example, the first member 61 may be compressed to have the first length L1 while being disposed in the first through-hole 10. The first member 61 disposed in the first through-hole 10 may provide a first elastic force F1 to an inner surface (e.g., an inner surface 13 of FIG. 4) of the first through-hole 10 in the first lengthwise direction L1.

In an embodiment, the stepped parts 613 of the first member 61 may be formed to be wider than the first width W1 of the first through-hole 10. In this case, the stepped parts 613 of the first member 61 may be pressed while the first member 61 is disposed in the first through-hole 10. For example, the stepped parts 613 of the first member 61 may be extruded to have the first width W1 while being disposed in the first through-hole 10. The stepped parts 613 of the first member 61 may provide a second elastic force F2 to the inner surface of the first through-hole 10 in a direction of the first width W1. In another embodiment, the second elastic force F2 may be provided by the first member 61 and the second member 62 together. For example, the second member 62 may be formed to be longer than illustrated to at least partially overlap the stepped parts 613 of the first member 61 with respect to the direction of the first width W1. A width defined by the stepped parts 613 and the second member 62 may be formed to be larger than the first width W1 of the first through-hole 10. The stepped parts 613 and the second member 62 may be pressed to have substantially the same width as the first width W1 to provide the second elastic force F2 in the first through-hole 10.

In an embodiment, the second member 62 may be configured to provide a third elastic force F3 to the inner surface of the first through-hole 10 together with the first member 61. For example, the second member 62 may be coupled to the first member 61 while being inserted between the stepped parts 613 of the first member 61. In a state, in which the first member 61 and the second member 62 are coupled to each other, a width defined by a portion of the first member 61 between the stepped parts 613 and the second member 62 together may be formed to be a width that is larger than the first width W1 of the first through-hole 10. The portion between the stepped parts 613 of the first member 61 and the second member 62 may be pressed to have substantially the same width as the first width W1 in the first through-hole 10. The first member 61 and the second member 62 may provide the third elastic force F3 in the direction of the first width W1 to the inner surface of the first through-hole 10.

In an embodiment, the first member 61 and the second member 62 may provide a fourth elastic force F4 in a direction that faces the first accommodation hole 63 formed therebetween. A direction of the fourth elastic force F4 may be opposite to the direction of the third elastic force F3. In an embodiment, a portion of the FPCB 30 that passes through the first accommodation hole 63 may be pressed by the fourth elastic force F4 that is provided by the first member 61 and the second member 62.

In an embodiment, through the first elastic force F1, the second elastic force F2, and the third elastic force F3 that are provided as the first sealing member 60 is formed to be at least partially larger than the first through-hole 10, a contact surface (e.g., the inner surface 13 of FIG. 4) of the first sealing member 60 and the first through-hole 10 may be sealed. Furthermore, through the fourth elastic force F4, a contact surface of the portion of the FPCB 30, which passes through the first accommodation hole 63, and the first sealing member 60 may be seated.

However, to seal the contact surface of the first sealing member 60 and the first through-hole 10, the first sealing member 60 is not limited to be configured to provide all of the first elastic force F1, the second elastic force F2, and the third elastic force F3. For example, the first sealing member 60 may be formed to be smaller than the first length L1 and/or the first width W1, and thus may be at least partially spaced apart from the inner surface of the first through-hole 10. When the first sealing member 60 is totally spaced apart from the inner surface of the first through-hole 10, neither of the first elastic force F1, the second elastic force F2, and the third elastic force F3 by the first sealing member 60 may be provided. When the first sealing member 60 is partially spaced apart from the inner surface of the first through-hole 10, any one or any two of the first elastic force F1, the second elastic force F2, and/or the third elastic force F3 by the first sealing member 60 may not be provided. The first waterproof member 81, which will be described with reference to FIG. 4, may be disposed in an aperture (not illustrated) formed as the first sealing member 60 and the first through-hole 10 are spaced apart from each other. The first waterproof member 81 may be formed in a scheme of applying a bonding liquid and then curing the bonding liquid. The first waterproof member 81 may be applied on an aperture between the first sealing member 60 and the first through-hole 10 and then be cured. Even though the first sealing member 60 is spaced apart from the first through-hole 10 whereby at least some of the first elastic force F1, the second elastic force F2, and/or the third elastic force F3 are not provided, the space between the first through-hole 10 and the first sealing member 60 may be sealed by the first waterproof member 81. The bonding liquid of the first waterproof member 81 applied to the aperture between the first through-hole 10 and the first sealing member 60 may have a viscosity such that it is prevented from being leaked before curing (for example, such that it is prevented from being leaked to an outside of the aperture).

Because the first sealing member 60 is pressed by the inner surface of the first through-hole 10 to be fixedly disposed in the first through-hole 10, if not, the first sealing member 60 may be moved in a process of disposing the first sealing member 60 in the first through-hole 10. For example, the first sealing member 60 may be configured to provide neither of the first to fourth elastic forces F1, F2, F3, and F4. In this case, the first member 61 and the second member 62 of the first sealing member 60 may be fixedly disposed in the first through-hole 10 through separate members. For example, the first member 61 and the second member 62 may be bonded to the inner surface of the first through-hole 10 or be bonded to another area (e.g., an area of the first support member 111 on an outside of the first through-hole 10), through an adhesive member such as double-sided tapes, for example, to be fixedly located in the interior of the first through-hole 10. However, the separate members for fixedly disposing the first member 61 and the second member 62 in the first through-hole 10 are not limited to the above-described double-sided tapes.

As another example, the first member 61 and the second member 62 of the first sealing member 60 are configured to provide the first elastic force F1 and the second elastic force F2, but may be configured not to provide the third elastic force F3 and the fourth elastic force F4. In this case, the first member 61 may be fixedly disposed in the first through-hole 10 through at least the first elastic force F1 and the second elastic force F2, whereas the second member 62 may move in the first through-hole 10. To prevent this, the second member 62 may be fixedly disposed in the first through-hole 10 through a separate member (e.g., a first adhesive member 86 of FIG. 4) such as a double-sided tape.

Furthermore, to seal a contact surface of the portion of the FPCB 30, which passes through the first accommodation hole 63 and the first sealing member 60, the first sealing member 60 is not necessarily limited to be configured to provide the fourth elastic force F4. For example, the width of the first accommodation hole 63 of the first sealing member 60 may be formed to be larger than a thickness of the portion of the FPCB 30, which passes through the first accommodation hole 63. In this case, the FPCB 30 may be spaced apart from the first sealing member 60. Furthermore, because the fourth elastic force F4 by the first sealing member 60 is not provided, the FPCB 30 may not be pressed by the first sealing member 60. The first waterproof member 81 may be disposed in the first accommodation hole 63 to surround the FPCB 30. For example, the first waterproof member 81 may be disposed to fill at least the space of the first accommodation hole 63 formed as the FPCB 30 and the first sealing member 60 are spaced part from each other. Even though the fourth elastic force F4 is not provided, the FPCB 30 located in the first accommodation hole 63 may be fixedly disposed without moving due to the first waterproof member 81. Furthermore, even though the fourth elastic force F4 is not provided, the first accommodation hole 63, through which the FPCB 30 passes, may be sealed by the first waterproof member 81. The bonding liquid of the first waterproof member 81, which is applied to the first accommodation hole 63, may have a specific viscosity so as not to be leaked before being cured. The first waterproof member 81 may have a specific hardness such that the portion of the FPCB 30, which is located in the first accommodation hole 63, is prevented from moving due to the cured bonding liquid.

In an embodiment, the first sealing member 60 may include an elastomer material such as rubber, for example, but the disclosure is not limited thereto.

It has been described that the first sealing member 60 includes the first member 61 and the second member 62 that are coupled to each other, but the disclosure is not limited thereto. For example, the first member 61 and the second member 62 of the first sealing member 60 may be integrally formed.

The electronic device 100 according to an embodiment may include a second sealing member 65 disposed in the second through-hole 20. The description provided with reference to the first sealing member 60 may be applied to the second sealing member 65 in substantially the same, similar, or corresponding scheme. For example, the second sealing member 65 may be disposed in the second through-hole 20 to at least partially close the second through-hole 20. The second sealing member 65 may include a third member 66 and a fourth member 67. The third member 66 and the fourth member 67 may be partially spaced apart from each other to define a second accommodation hole 68. The FPCB 30 may pass through the second accommodation hole 68. The second sealing member 65 may be configured to provide an elastic force to the inner surface of the second through-hole 20 as in the description provided with reference to the first sealing member 60, but may not.

Figure 4:
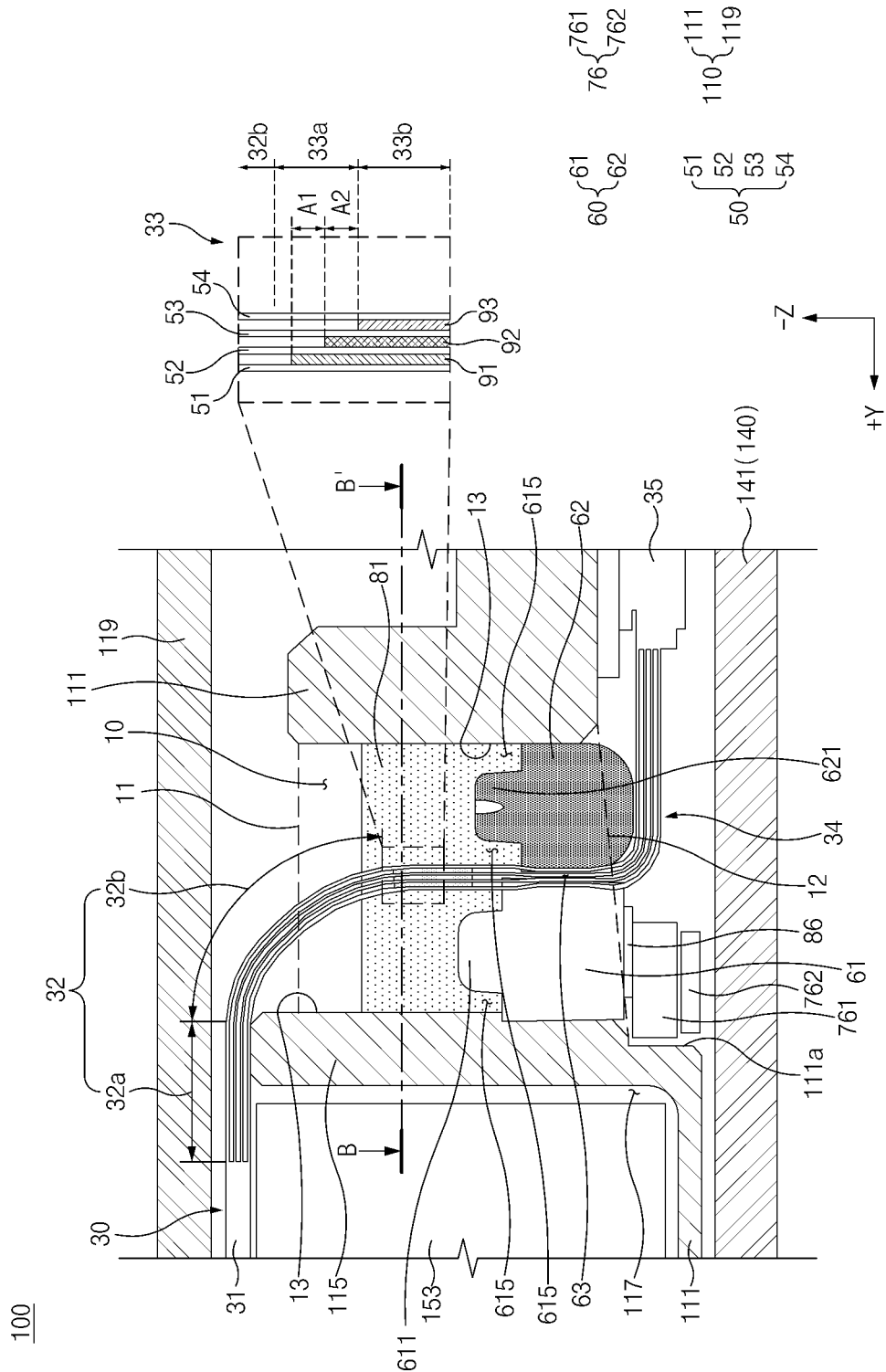
FIG. 4 is a cross-sectional view of an electronic device according to an embodiment.

FIG. 4 is a cross-sectional view of an electronic device according to an embodiment. FIG. 4 may a cross-sectional view taken along line A-A' of FIG. 3C.

Referring to FIG. 4, the first support member 111 of the first housing 110 may include a partition wall (or a rib) 115 that extends in a height direction (e.g., the Z axis direction) of the electronic device 100. In an embodiment, the first support member 111 may include a recess 117 defined by the partition wall 115. The first battery 153 may be at least partially disposed in the recess 117.

In an embodiment, the recess 117 and the first through-hole 10 may be located while the partition wall 115 being interposed therebetween. In an embodiment, the first through-hole 10 may allow a first opening 11 and a second opening 12 formed in the first support member 111 to communicate each other. In an embodiment, the first through-hole 10 may extend from the first opening 11 to the second opening 12 in a direction that becomes farther away from the first rear plate 119. For example, the first through-hole 10 may extend from the first opening 11 to the second opening 12 toward the display 140 (e.g., in the +Z axis direction). In an embodiment, the first opening 11 may be substantially parallel to the first rear plate 119. In an embodiment, it is illustrated that the second opening 12 is inclined with respect to the first rear plate 119, but the disclosure is not limited thereto. In another embodiment, the second opening 12 may be substantially parallel to the first rear plate 119.

The electronic device 100 according to an embodiment may include the first waterproof member 81 disposed in the first through-hole 10. In an embodiment, the first waterproof member 81 may be disposed in the first through-hole 10. For example, the first waterproof member 81 may be disposed on the first sealing member 60 (e.g., the −Z axis direction). As another example, the first waterproof member 81 may be disposed in the first through-hole 10 between the first sealing member 60 and the first opening 11. In an embodiment, the first waterproof member 81 may be disposed in the first through-hole 10 at least partially from the first sealing member 60 to the first opening 11. In an embodiment, the first waterproof member 81 may surround the FPCB 30. As in the description provided with reference to FIG. 3D, the first sealing member 60 according to another embodiment may be at least partially spaced apart from the FPCB 30 and/or the inner surface 13 of the first through-hole 10, and the first waterproof member 81 be additionally at least partially disposed in a space (e.g., the first accommodation hole 63 or a space formed as the inner surface 13 and the first sealing member 60 are spaced apart from each other) formed as the first sealing member 60 is spaced apart.

In an embodiment, the first waterproof member 81 may be filled in the first through-hole 10. For example, the first waterproof member 81 may be formed by applying the bonding liquid in the first through-hole 10 through the first opening 11 after the first sealing member 60 and the FPCB 30 are disposed in the first through-hole 10, and then curing the bonding liquid. In an embodiment, the bonding liquid, for example, may include a resin that may be cured (e.g., thermally cured or UV cured) after a liquid-state resin is applied in the first through-hole 10. For example, the bonding liquid may include a resin that may be manufactured in a cured in place gasket (CIPG), for example, a silicon rubber, but the disclosure is not limited to the above-described example.

In an embodiment, the first waterproof member 81 may provide an elastic force (e.g., the third elastic force F3 of FIG. 3D) in a direction that faces the inner surface 13 of the first through-hole 10, and an elastic force (e.g., the fourth elastic force F4 of FIG. 3D) in a direction that faces the FPCB 30 surrounded by the first member 61 and the second member 62.

In an embodiment, the first waterproof member 81 may prevent foreign substances including, but not limited to, moisture and dust from passing through the first sealing member 60 to be introduced into the first through-hole 10. For example, the first waterproof member 81 may prevent foreign substances from being introduced between the inner surface 13 of the first through-hole 10 and the first member 61, between the first member 61 and the FPCB 30, between the FPCB 30 and the second member 62, between the first member 61 and the second member 62, and between the inner surface 13 of the first through-hole 10 and the second member 62.

In an embodiment, the first member 61 and the second member 62 may include a first protrusion 611 and a second protrusion 621 that extend toward the first opening 11, respectively. In an embodiment, the first protrusion 611 may be located between the inner surface 13 of the first through-hole 10 and the second protrusion 621. In an embodiment, the first protrusion 611 may be spaced apart from the inner surface 13 of the first through-hole 10 and the second protrusion 621. In an embodiment, the second protrusion 621 may be spaced apart from the inner surface 13 of the first through-hole 10. In an embodiment, valleys 615 that extend in a depth direction (e.g., the Z axis direction) may be formed by the first protrusion 611, the second protrusion 621, and the inner surface 13 of the first through-hole 10. In an embodiment, when the first waterproof member 81 is applied, it may be applied to the valleys 615. Through this, a defect rate due to a deviation of an application process of the first waterproof member 81 may be reduced, and a waterproof/dustproof performance may be enhanced.

In an embodiment, the FPCB 30 may include a plurality of layers 50. For example, a plurality of layers 50 may include a first layer 51, a second layer 52, a third layer 53, and a fourth layer 54 arranged (e.g., stacked) in a sequence thereof. However, the number of the plurality of layers 50 is not limited to the illustrated example. In another embodiment, the plurality of layers 50 may include layers, the number of which is larger than that illustrated in FIG. 4, or may include layers, the number of which is smaller than that illustrated in FIG. 4. For example, the plurality of layers 50 may include a fifth layer (not illustrated) laminated on the fourth layer 54. For example, unlike the illustration, the plurality of layers 50 may include only the first layer 51 and the second layer 52 (e.g., the plurality of layers 50 of FIG. 6E). As another example, the plurality of layers 50 may include only the first layer 51, the second layer 52, and the third layer 53 (e.g., the plurality of layers 50 of FIG. 6D).

The FPCB 30 according to an embodiment may include a first lamination part (or a first lamination portion) 31, a first curved part (or a first curved portion) 32, a second lamination part (or a second lamination portion) 33, a second curved part (or a second curved portion) 34, and a third lamination part (or a third lamination portion) 35.

In an embodiment, the first lamination part 31 may be formed to be flexible. In an embodiment, the first lamination part 31 may include a part, in which at least two of the plurality of layers 50 are laminated on each other. For example, the first lamination part 31 may be a part, in which, among the plurality of layers 50, the first layer 51 and the second layer 52 are bonded to each other. In this case, the at least two layers may be bonded to each other through the adhesive layer interposed therebetween. The adhesive layer may include an adhesive including an epoxy-based resin, but the disclosure is not limited thereto.

In another embodiment, the first lamination part 31 may include a rigid part. In this case, all of the plurality of layers 50 may be laminated on each other through a bonding sheet, such as a prepreg, in the rigid part. For example, the first to fourth layers 51 to 54 may be bonded to each other through the bonding sheet, and may be formed to be rigid.

In an embodiment, the first lamination part 31 may be located in the first housing 110. For example, the first lamination part 31 may be disposed between the first rear plate 119 and the first support member 111. In an embodiment, the first lamination part 31 may be located between the first battery 153 and the first rear plate 119.

In an embodiment, the first lamination part 31 may be located to be more distant from the second housing (not illustrated) (e.g., the second housing 120 of FIG. 3A) than the first through-hole 10. For example, the first through-hole 10 may be located between the first lamination part 31 and the second housing. In an embodiment, the first lamination part 31 may extend in a direction that faces the second housing from an outside of the first through-hole 10. In an embodiment, the first lamination part 31 may extend toward the first opening 11 from the outside of the first through-hole 10.

In an embodiment, the first lamination part 31 may extend in a direction that is different from the extension direction of the first through-hole 10. For example, the first through-hole 10 may extend in a direction that becomes farther away from the first rear plate 119. Unlike this, the first lamination part 31 may extend substantially in parallel to the first rear plate 119.

In an embodiment, the first curved part 32 may extend from the first lamination part 31 toward a second lamination part 33. In an embodiment, the first curved part 32 may extend from the first lamination part 31, and may pass through the first opening 11. In an embodiment, the first curved part 32 may pass through the first opening 11 and may extend into the first through-hole 10.

Figure 5A:
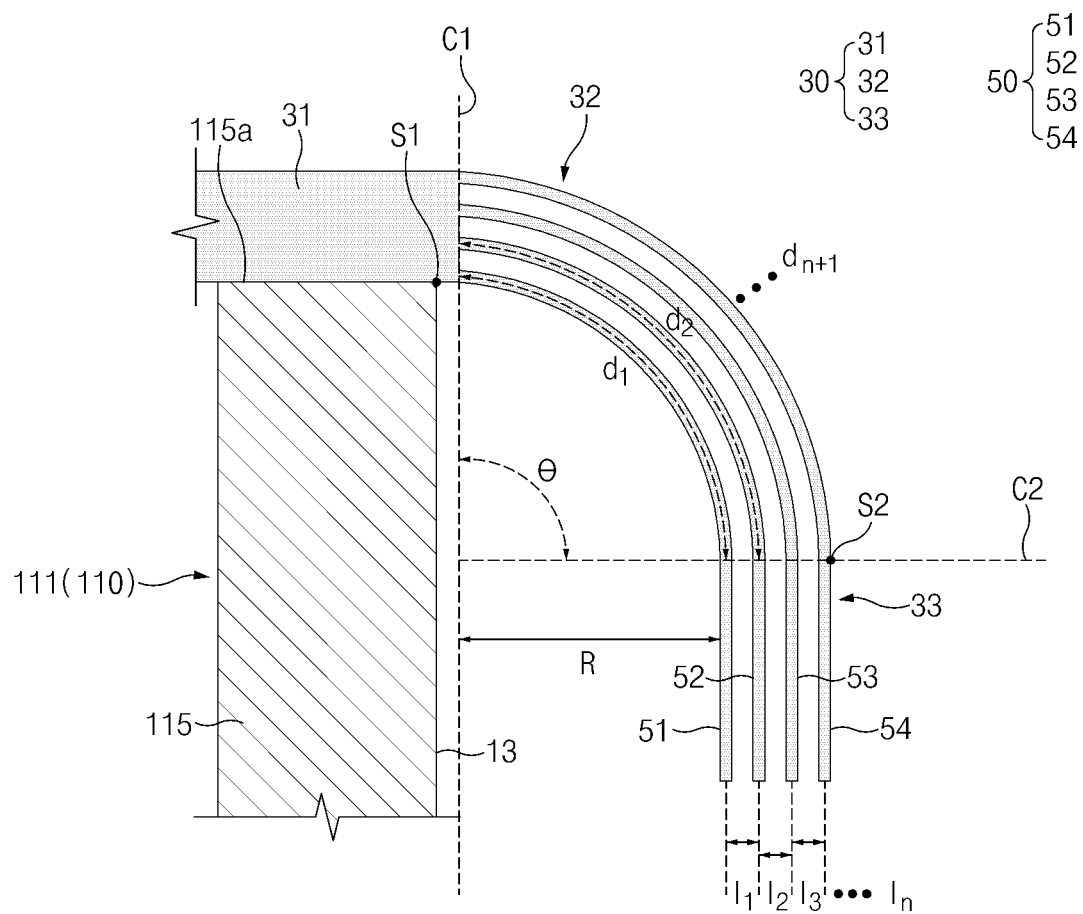
FIG. 5A is a view illustrating a stepped lamination structure of an FPCB according to an embodiment.

In an embodiment, the first curved part 32 may include a part that is at least partially curved. For example, the first curved part 32 may include a first section 32a that extends from the first lamination part 31, and a second section 32b that extends from the first section 32a. In an embodiment, the first section 32a may extend at an inclination that is substantially the same as that of the first lamination part 31. In an embodiment, the first section 32a may be disposed between the first rear plate 119 and the first support member 111. In an embodiment, the first section 32a may be at least partially supported by the partition wall 115. In an embodiment, the second section 32b may be curved while extending from the first section 32a into the first through-hole 10. In an embodiment, portions of the plurality of layers 50 of the FPCB 30 corresponding to the second section 32b may be curved. In another embodiment, the first curved part 32 may not include the first section 32a. In this case, as illustrated in FIG. 5A, it may be understood that the first lamination part 31 extends to the partition wall 115 and the second section 32b extends from the first lamination part 31 to be curved, but the disclosure is not limited thereto.

In an embodiment, portions of the plurality of layers 50 corresponding to the first curved part 32 may be separated from each other. For example, portions of the first to fourth layers 51 to 54 corresponding to the first curved part 32 may be separated from each other.

In an embodiment, the second lamination part 33 may extend from the first curved part 32 inside the first through-hole 10. In an embodiment, the second lamination part 33 may extend from the first curved part 32 toward the first sealing member 60. In an embodiment, the second lamination part 33 may extend from the first curved part 32 toward the display 140. In an embodiment, the second lamination part 33 may extend from the first curved part 32 to the first sealing member 60. In another embodiment, the second lamination part 33 may extend from the first curved part 32 to at least a portion of the first accommodation hole 63 of the first sealing member 60.

In an embodiment, portions of the first to fourth layers 51 to 54 corresponding to the second lamination part 33 may be laminated on each other. The first layer 51 and the second layer 52 may be bonded to each other through a first adhesive layer 91 interposed therebetween. The second layer 52 and the third layer 53 may be laminated on each other through a second adhesive layer 92 interposed therebetween. The third layer 53 and the fourth layer 54 may be bonded to each other through a third adhesive layer 93 disposed therebetween.

In an embodiment, the layers laminated on each other through the first adhesive layer 91, the second adhesive layer 92, and the third adhesive layer 93 may be laminated to define different lamination areas. For example, the area or location at which first adhesive layer 91 contacts the first layer 51 and the second layer 52 defines a first lamination area, the area or location at which second adhesive layer 92 contacts the second layer 52 and the third layer 53 defines a second lamination area, and the area or location at which third adhesive layer 93 contacts the third layer 53 and the fourth layer 54 defines a third lamination area.

According to an embodiment, the first layer 51 and the second layer 52 may be laminated on each other to have an area that is larger than those of the second layer 52 and the third layer 53 laminated by the second adhesive layer 92 by a first area A1, through the first adhesive layer 91. Furthermore, through the second adhesive layer 92, the second layer 52 and the third layer 53 may be laminated on each other with an area that is larger than those of the third layer 53 and the fourth layer 54 laminated through the third adhesive layer 93 by a second area A2.

In an embodiment, the second lamination part 33 may include a part, in which the plurality of layers 50 of the FPCB 30 are laminated on each other to define different lamination areas. In an embodiment, the second lamination part 33 may include a third section 33a interposed between the second section 32b and a fourth section 33b. According to one or more non-limited embodiments described herein, the second section 32b can define a first lamination area, the third section 33a can define a second lamination area, and the fourth section 33b can define a third lamination area.

According to an embodiment, the third section 33a extends from the first curved part 32 (e.g., the second section 32b), and the fourth section 33b extends from the third section 33a. In an embodiment, portions of the layers 50 corresponding to the third section 33a may be laminated to each other at different lamination areas (or different extents). For example, portions of the third layer 53 and the fourth layer 54 corresponding to the third section 33a may not be laminated on each other, but may be separated from each other. In an embodiment, portions of the first layer 51 and the second layer 52 corresponding to the third section 33a may be laminated on each other by the first area A1 and the second area A2, through the first adhesive layer 91. In an embodiment, portions of the second layer 52 and the third layer 53 corresponding to the third section 33a may be laminated on each other by the second area A2, through the second adhesive layer 92.

In an embodiment, the first to third adhesive layers 91 to 93 may include first ends that face the first opening 11, and second ends that face the second opening 12. In an embodiment, because the plurality of layers 50 are bonded to each other with different areas in the third section, the first ends may be located at distances that are different from that of the first opening 11 (or the first rear plate 119).

In an embodiment, portions of the layers 50 corresponding to the fourth section 33b may be laminated on each other with the same or different areas. In an embodiment, when portions of the plurality of layers 50 corresponding to the fourth section 33b are laminated on each other with substantially the same area, the second ends of the first to third adhesive layers 91 to 93 may be substantially aligned (or coincide with each other) along a direction (e.g., the Y axis direction) that is perpendicular to an extension direction of the fourth section 33b. In another embodiment, when portions of the plurality of layers 50 corresponding to the fourth section 33b are laminated on each other with different areas, the second ends of the first to third adhesive layers 91 to 93 may be located at locations that are different from that of the second opening 12 (or the display 140). For example, the second end of the first adhesive layer 91 corresponding to the fourth section 33b may extend to the first sealing member 60. Unlike this, the second end of the second adhesive layer 92 corresponding to the fourth section 33b may extend to an interior of the first accommodation hole 63 of the first sealing member 60. However, the disclosure is not limited by the above-described example.

The FPCB 30 according to an embodiment may include a section, in which at least portions of the plurality of layers 50 are laminated on each other at different lamination areas (or different extents), like the above-described third section 33a of the second lamination part 33. As described above, the structure of the second lamination part 33 of the FPCB 30, in which the plurality of layers are laminated on each other at different lamination areas, may be referenced as a "stepped lamination structure". In one or more non-limiting embodiments, the second lamination part 33 allows for using adhesive layers 91, 92 and 93 to laminate the plurality of layers 51, 52, 53 and 54 at different lamination areas. For example, the third lamination area (e.g., defined by the section 33b) can contain the adhesive layers 91, 92 and 93, and the second lamination area (e.g., defined by the section 33a) can contain the first and second adhesive layers 91 and 92, while excluding the third adhesive layer 93. Accordingly, the stepped lamination structure of second lamination part 33 can prevent foreign substances from being introduced between the plurality of layers 50 of the FPCB 30 through the first accommodation hole 63 of the first sealing member 60. This will be described below with reference to other drawings.

In an embodiment, the second curved part 34 may extend from the second lamination part 33. According to one or more embodiments, a portion of the second curved part 34 is interposed between the first member 61 and the second member 62. In an embodiment, the second curved part 34 may extend from the second lamination part 33, and may pass through the second opening 12. In an embodiment, the second curved part 34 may pass through the second opening 12 and may extend to an outside of the first through-hole 10. In an embodiment, the second curved part 34 may pass through the second opening 12 and may extend in a direction that faces the second housing. In an embodiment, the second curved part 34 may extend from the second lamination part 33 to the third lamination part 35.

In an embodiment, the second curved part 34 may include a part that is at least partially curved. For example, the second curved part 34 may include a part, in which the plurality of layers 50 of the FPCB 30 are curved. In an embodiment, the second curved part 34 may include a part that is curved to be opposite to the first curved part 32. For example, with reference to the illustration of FIG. 4, a curvature center of the curved part of the first curved part 32 may be adjacent to the first layer 51, whereas a curvature center of the curved part of the second curved part 34 may be adjacent to the fourth layer 54. In other words, with reference to the illustration of FIG. 4, the first curved part 32 may be curved while extending from the first lamination part 31 along a clockwise direction, whereas the second curved part 34 may be curved while extending in a counterclockwise direction.

In an embodiment, portions of the plurality of layers 50 corresponding to the second curved part 34 may be separated from each other. For example, portions of the first to fourth layers 51 to 54 corresponding to the second curved part 34 may be separated from each other.

In an embodiment, the third lamination part 35 may be located in the first housing 110. For example, the third lamination part 35 may be disposed between the first support member 111 and the display 140. In an embodiment, the third lamination part 35 may be disposed on the first support member 111, and may be supported by the first support member 111. In an embodiment, the third lamination part 35 may be disposed at a location that is opposite to the first lamination part 31 with respect to the first support member 111. For example, the third lamination part 35 may be located on one side (e.g., the +Z axis direction) of the first support member 111, and the first lamination part 31 may be disposed on an opposite side (e.g., the −Z axis direction) of the first support member 111, which is an opposite side to the one side.

In an embodiment, the third lamination part 35 may be located closer to the second housing than the first through-hole 10. For example, the third lamination part 35 may be located between the first through-hole 10 and the second housing. In an embodiment, the third lamination part 35 may extend in a direction that faces the second housing from an outside of the first through-hole 10. In an embodiment, the third lamination part 35 may extend from the second curved part 34 toward the second housing.

In an embodiment, the third lamination part 35 may extend in a direction that is different from the extension direction of the first through-hole 10. For example, the first through-hole 10 may extend from the first rear plate 119 in a direction that faces the first area 141 of the display 140. In an embodiment, the third lamination part 35 may extend substantially in parallel to the first area 141 of the display 140.

The electronic device 100 according to an embodiment may include a first plate structure 76. In an embodiment, the first plate structure 76 may be disposed adjacent to an extension surface 111a of the first support member 111, which extends from a portion of the inner surface 13 of the first through-hole 10 to an outside of the second opening 12. In an embodiment, the first plate structure 76 may support the display 140, together with the first support member 111.

In an embodiment, the first plate structure 76 may include a first plate 761, and a second plate 762 disposed on the first plate 761. In an embodiment, the first adhesive member 86 may be disposed between the second plate 762 and the first member 61. In an embodiment, through the first adhesive member 86, a partial area of the second plate 762 may be bonded to the first member 61. In an embodiment, the first adhesive member 86 may include a double-sided tape, but the disclosure is not limited thereto.

FIG. 5A is a view illustrating a stepped lamination structure of an FPCB according to an embodiment.

Figure 5B:
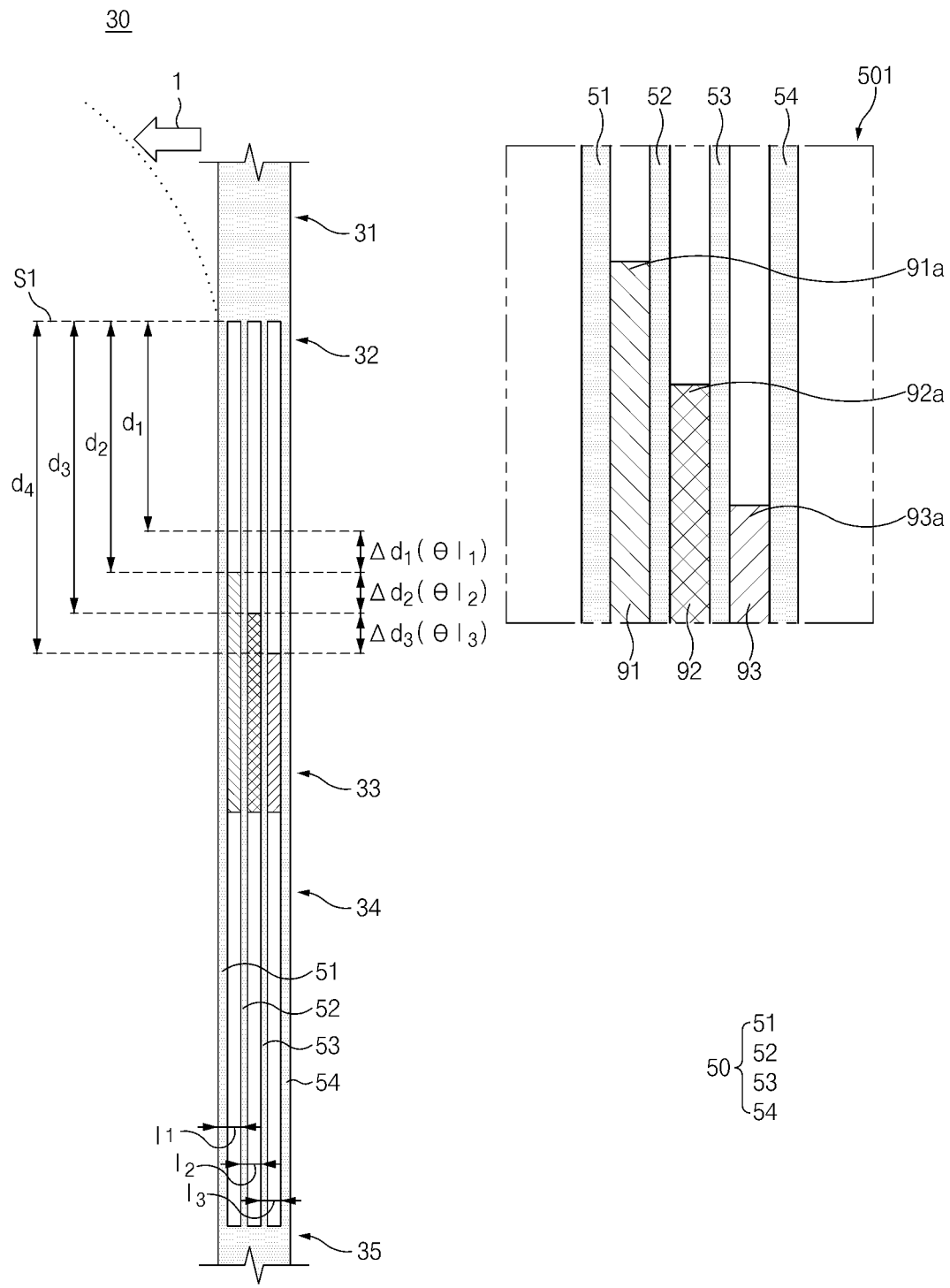
FIG. 5B is a view illustrating a stepped lamination structure of an FPCB according to an embodiment.

FIG. 5B is a view illustrating a stepped lamination structure of an FPCB according to an embodiment. In FIG. 5B, the FPCB in the flat state is illustrated for convenience of description. A direction 1 of FIG. 5B may refer to a direction, in which the FPCB 30 is to be curved. Reference numeral 501 of FIG. 5B denotes ends of the adhesive layers.

Figure 5C:
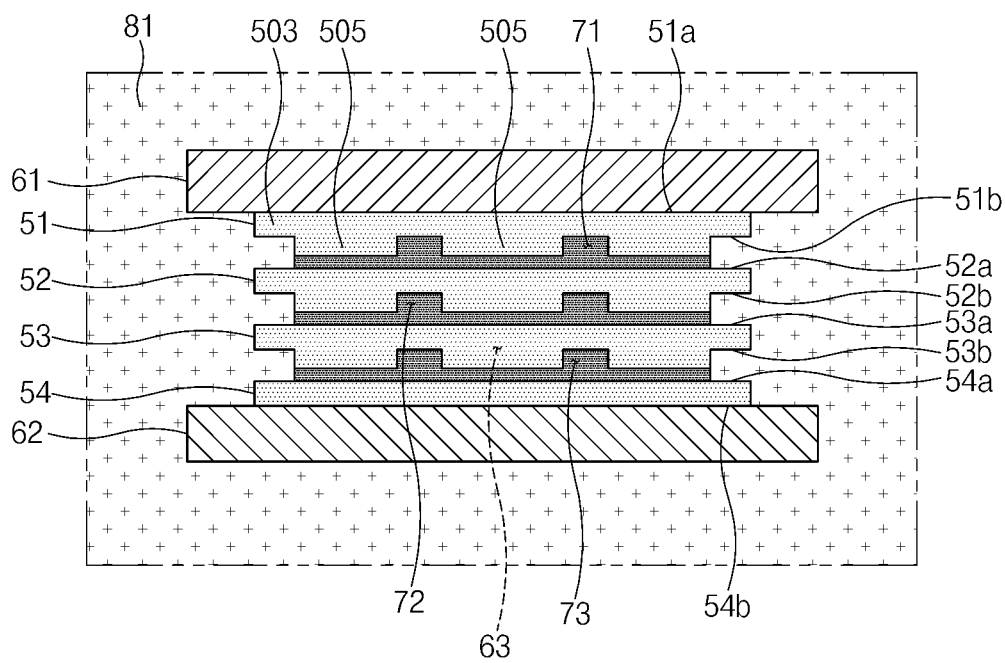
FIG. 5C is a view illustrating a stepped lamination structure of an FPCB according to an embodiment.

FIG. 5C is a view illustrating a stepped lamination structure of an FPCB according to an embodiment. FIG. 5C may be a cross-sectional view of the stepped lamination structure of the FPCB, taken in a direction that is perpendicular to a lengthwise direction. FIG. 5C may be a cross-sectional view, taken along line B-B' of FIG. 4. In FIG. 5C, the first member 61, the second member 62, and the first accommodation hole 63 are illustrated together for convenience of description. Although a border of the first accommodation hole 63 is not illustrated in FIG. 5C, it may be understood that the first accommodation hole 63 is located between the first member 61 and the second member 62 and at least partially overlaps the FPCB 30.

In FIG. 5A, the illustration of the adhesive layers (e.g., the first to third adhesive layers 91 to 93 of FIG. 4) interposed between the plurality of layers 50 are omitted for convenience of description.

Referring to FIG. 5A, in an embodiment, the plurality of layers 50 may be curved from an end surface 115a of the partition wall 115 of the first support member 111 to the second lamination part 33 that extends substantially straight. For example, portions of the plurality of layers 50 corresponding to the first curved part 32 (or the second section 32b of FIG. 4) may be curved from a border S1 between the end surface 115a of the partition wall 115 and the inner surface 13 of the first through-hole 10 to a start point S2 of a section (e.g., the fourth section 33b of FIG. 4), in which the FPCB 30 extends substantially straight. In this case, the first curved part 32 may be curved at an angle corresponding to a central angle θ thereof. In an embodiment, the central angle θ may refer to an angle defined by a first reference line C1 and a second reference line C2. In an embodiment, the first reference line C1 may be a straight line that is perpendicular to the extension direction of the first lamination part 31 (or the first section 32a of FIG. 4) and passes through the border S1 between the end surface 115a and the inner surface 13 (although FIG. 5A illustrates that the first reference line C1 and the border S1 are spaced apart from each other for convenience of classification, the disclosure is not limited to the illustrated embodiment). In an embodiment, the second reference line C2 may be a straight line that passes through the start point S2 of the section, in which the FPCB 30 extends substantially straight in the first through-hole 10 and is perpendicular to the extension direction of the FPCB 30.

In an embodiment, the plurality of layers 50 may include the first layer 51, the second layer 52, the third layer 53, . . . , and an n-th layer, which are laminated in a closer sequence to the partition wall 115. In an embodiment, a portion of the first layer 51 corresponding to the first curved part 32 may be curved along a radius R. In this case, a length $d_1$ of the first section of the first layer 51 corresponding to the first curved part 32 may be represented as in Equation 1 as follows.

$$d_1 = \theta R \qquad \text{[Equation 1]}$$

In an embodiment, the second layer 52, the third layer 53, the fourth layer 54, . . . , and the n-th layer may be spaced apart from the first layer 51, the second layer 52, the third layer 53, . . . , and the (n−1)-th layer, by a first distance $l_1$, a second distance $l_2$, a third distance $l_3$, . . . , and an n-th distance $l_n$. In an embodiment, lamination thicknesses of the second layer 52, the third layer 53, the fourth layer 54, . . . , and the n-th layer may be the first distance $l_1$, the second distance $l_2$, the third distance $l_3$, . . . , and the n-th distance $l_n$. In an embodiment, an n-th section length $d_n$ of the n-th layer may be represented as in Equation 2 as follows.

$$d_n = \theta(l_{n-1} + l_{n-2} + \ldots + l_1 + R) \qquad \text{[Equation 2]}$$

In an embodiment, a difference between the section lengths of the n-th layer and the (n−1)-th layer that are adjacent to each other may be represented as in Equation 3 as follows.

$$\Delta d_n = d_{n+1} - d_n = \theta l_n \qquad \text{[Equation 3]}$$

In an embodiment, as in Equation 3, a difference value $\Delta d_n$ of the section lengths of the (n+1)-th layer and the n-th layer that are adjacent to each other may be defined by a product of the central angle θ, by which the first curved part 32 is curved, and a spacing distance $l_n$ of the layers.

With reference to Equation 3, the plurality of layers 50 of the FPCB 30 according to an embodiment may define length deviations in a curved section, like the first curved part 32.

The FPCB 30 of the electronic device 100 according to an embodiment may include a stepped lamination structure based on the length deviations of the layers represented in Equation 3. Referring to FIG. 5B, in an embodiment, a first difference value $\Delta d_1$ of the section lengths of the second layer 52 and the first layer 51 corresponding to the first curved part 32 may be represented by a product of the central angle θ and the first distance $l_1$ ($\Delta d_1 = \theta \times l_1$). In an embodiment, the second layer 52 and the first layer 51 may be laminated on each other through the first adhesive layer 91. In an embodiment, the first adhesive layer 91 may be spaced apart from the first lamination part 31 (or the second section 32b of FIG. 4) by at least the second section length $d_2$. For example, a distance between the first end 91a of the first adhesive layer 91 that faces the first lamination part 31, and the border S1 may be at least the second section length $d_2$. In an embodiment, the second section length $d_2$ of the second layer 52 may be a sum of the first section length $d_1$ of the first layer 51 and the first difference value $\Delta d_1$.

A second difference value $\Delta d_2$ of the section lengths of the third layer 53 and the second layer 52, which correspond to the first curved part 32 according to an embodiment may be represented by a product of the central angle θ and the second distance $l_2$ ($\Delta d_2 = \theta \times l_2$). In an embodiment, the third layer 53 and the second layer 52 may be laminated on each other through the second adhesive layer 92. In an embodiment, the third layer 53 and the second layer 52 may be laminated with an area that is smaller than an area, by which the first layer 51 and the second layer 52 are laminated on each other, by an area (e.g., the first area A1 of FIG. 4) corresponding to the second difference value $\Delta d_2$.

In an embodiment, the second adhesive layer 92 may be formed to be shorter than the first adhesive layer 91 by the second difference value $\Delta d_2$. For example, a second end 92a of the second adhesive layer 92, which faces the first lamination part 31, may be located farther away from the border S1 than a first end 91a by at least the second difference value $\Delta d_2$. In an embodiment, the second adhesive layer 92 may be spaced apart from the first lamination part 31 (or the second section 32b of FIG. 4) by at least the third section length $d_3$. For example, a distance between the second end 92a of the second adhesive layer 92 and the border S1 may be at least the third section length $d_3$. In an embodiment, the third section length $d_3$ of the third layer 53 may be a sum of the second section length $d_2$ and the second difference value $\Delta d_2$.

A third difference value $\Delta d_3$ of the section lengths of the fourth layer 54 and the third layer 53, which correspond to the first curved part 32 according to an embodiment may be represented by a product of the central angle θ and the third distance $l_3$ ($\Delta d_3 = \theta \times l_3$). In an embodiment, the fourth layer 54 and the third layer 53 may be laminated on each other through the third adhesive layer 93. In an embodiment, the fourth layer 54 and the third layer 53 may be laminated with an area that is smaller than an area, by which the second layer 52 and the third layer 53 are laminated on each other, by an area (e.g., the second area A2 of FIG. 4) corresponding to the third difference value $\Delta d_3$.

In an embodiment, the third adhesive layer 93 may be formed to be shorter than the second adhesive layer 92 by the third difference value $\Delta d_3$. For example, a third end 93a of the third adhesive layer 93, which faces the first lamination part 31, may be located farther away from the border S1 than the second end 92a by at least the third difference value $\Delta d_3$. In an embodiment, the third adhesive layer 93 may be spaced apart from the first lamination part 31 (or the second section 32b of FIG. 4) by at least the fourth section length d4. For example, a distance between the third end 93a of the third adhesive layer 93 and the border S1 may be at least the fourth section length d4. In an embodiment, the fourth section length d4 of the fourth layer 54 may be a sum of the third section length $d_3$ and the third difference value $\Delta d_3$.

Unlike the above-described stepped lamination structure, portions of the plurality of layers 50 corresponding to the second lamination part 33 may be laminated on each other with the same area. For example, the portions of the first to third adhesive layers 91 to 93 corresponding to the second lamination part 33 may be disposed such that the first to third ends 91a, 92a, and 93a coincide with each other. In this case, because the portions of the plurality of layers 50 corresponding to the second curved part 34 are fixed at the same location, they cannot accommodate length changes due to curving thereof at different radii. Consequently, the FPCB 30 may be deformed differently from the design. For example, the plurality of layers 50 may be widened with respect to each other. When the plurality of layers 50 are deformed, the FPCB 30 may apply a repulsive force while contacting another adjacent configuration, and the FPCB 30 may be damaged. In addition, when the FPCB 30 applies a repulsive force to the first rear plate (e.g., the first rear plate 119 of FIG. 4) that is adjacent to the second curved part 34, the first rear plate comes over whereby a fine aperture, through which foreign substance may be introduced, may be formed.

The electronic device 100 according to an embodiment may maintain a shape of a part (e.g., the second curved part 34), in which the FPCB 30 is curved, through the stepped lamination structure. For example, as in the stepped lamination structure, the plurality of layers 50 are laminated on each other with different areas, whereby the shape of the second curved part 34 of the FPCB 30 may be maintained. For example, the stepped lamination structure may accommodate a length change due to the curving of the portions of the plurality of layers 50 corresponding to the second curved part 34 at different radii, whereby the shape of the FPCB 30 may be maintained.

The electronic device 100 according to an embodiment may prevent foreign substances from being introduced between the plurality of layers 50 of the FPCB 30 through the above-described stepped lamination structure. Referring to FIG. 5C, the FPCB 30 according to an embodiment may include at least one valley 70 formed in the plurality of layers 50. In an embodiment, the adhesive layers 90 (e.g., the first to third adhesive layers 91 to 93 may be interposed between the plurality of layers 50 to be filled in the at least one valley 70).

In an embodiment, the at least one valley 70 may be formed by transmission lines provided in the plurality of layers 50 of the FPCB 30. For example, the first layer 51 may include a base layer 503, and transmission lines 505 disposed on the base layer 503. In an embodiment, to prevent signals transmitted through the transmission lines 505 from being disturbed, the transmission lines 505 may be spaced apart from each other on the base layer 503. In an embodiment, the transmission lines 505 may protrude from a second surface 51b of the first layer 51, and the transmission lines 505 may define a first valley 71 together with the base layer 503.

In an embodiment, the at least one valley 70 may include the first valley 71, a second valley 72, and a third valley 73. In an embodiment, the at least one valley 70 may extend along a direction, in which the transmission lines provided in the plurality of layers 50 extend. For example, the first valley 71 may extend along a direction, in which the transmission lines 505 of the first layer 51 extend. In an embodiment, the transmission lines 505 may extend along the lengthwise direction of the FPCB 30, and the first valley 71 also may extend along the lengthwise direction of the FPCB 30.

In an embodiment, the base layer 503 may include a resin manufactured in a form of a film to be curved. For example, the base layer 503 may include polyimide, but the disclosure is not limited thereto. In an embodiment, the transmission lines 505 may include a conductive material to transmit electrical signals. For example, the transmission lines 505 may include copper, but the disclosure is not limited thereto.

Although not illustrated, the FPCB 30 according to an embodiment may include protection layers (e.g., coverlays) that cover the transmission lines provided in the plurality of layers 50. For example, the protection layers may be disposed at least on the second surface 51b of the first layer 51, a fourth surface 52b of the second layer 52, and a sixth surface 53b of the third layer 53, respectively. The protection layer, for example, may be attached to the plurality of layers 50 through an adhesive (not illustrated), but the disclosure is not limited to the above-described example. The protection layer, for example, may be manufactured in a form of a film by using a flexible resin (e.g., polyimide), but the disclosure is not limited thereto.

In an embodiment, the first layer 51 may include a first surface 51a that is adjacent to the first member 61, and the second surface 51b that faces an opposite direction to the first surface 51a and is adjacent to the second layer 52. In an embodiment, the second layer 52 may include a third surface 52a that is adjacent to the first layer 51, and the fourth surface 52b that faces an opposite direction to the third surface 52a and is adjacent to the third layer 53. In an embodiment, the third layer 53 may include a fifth surface 53a that is adjacent to the second layer 52, and the sixth surface 53b that faces an opposite direction to the fifth surface 53a and is adjacent to the fourth layer 54. In an embodiment, the fourth layer 54 may include a seventh surface 54a that is adjacent to the third layer 53, and an eighth surface 54b that faces an opposite direction to the seventh surface 54a and is adjacent to the second member 62.

In an embodiment, the first valley 71 may be formed on the second surface 51b of the first layer 51. In an embodiment, the adhesive layer 90 (e.g., the first adhesive layer 91) may be filled in the first valley 71. In an embodiment, the adhesive layer 90 may be interposed between the second surface 51b of the first layer 51 and the third surface 52a of the second layer 52 to be filled in the first valley 71. In an embodiment, one or a plurality of first valleys 71 may be formed along the transmission lines provided by the first layer 51.

In an embodiment, the second valley 72 may be formed on the fourth surface 52b of the second layer 52. In an embodiment, the adhesive layer 90 (e.g., the second adhesive layer 92) may be filled in the second valley 72. In an embodiment, the adhesive layer 90 may be interposed between the fourth surface 52b of the second layer 52 and the fifth surface 53a of the third layer 53 to be filled in the second valley 72. In an embodiment, one or a plurality of second valleys 72 may be formed along the transmission lines provided by the second layer 52.

In an embodiment, the third valley 73 may be formed on the sixth surface 53b of the third layer 53. In an embodiment, the adhesive layer 90 (e.g., the third adhesive layer 93) may be filled in the third valley 73. In an embodiment, the adhesive layer 90 may be interposed between the sixth surface 53b of the third layer 53 and the seventh surface 54a of the fourth layer 54 to be filled in the third valley 73. In an embodiment, one or a plurality of third valleys 73 may be formed along the transmission lines provided by the third layer 53.

In an embodiment, the first waterproof member 81 may surround the entire FPCB 30.

In terms of a conventional device that omits the adhesive layers 90 interposed between the plurality of layers 50, even when the plurality of layers 50 are pressed by the first sealing member 60 and/or are surrounded by the first waterproof member 81, foreign substances may be introduced through the at least one valley 70. One or more non-limiting embodiments of the present disclosure prevent the introduction of foreign substances by providing a method for filling the at least one valley 70 by using the adhesive of the protection layer. It may be difficult to apply the adhesive only to some sections of the FPCB 30 or to apply adhesive only to some sections such that thicknesses thereof are different. Accordingly, the adhesive can be applied to all the sections of the FPCB 30 thickly to prevent foreign substances from being introduced through the at least one valley 70, and which increases the total thickness of the FPCB 30. When the total thickness of the FPCB 30 is increased, the shape of the FPCB 30 may be badly influenced, and a volume of the electronic device 100 may be increased.

The electronic device 100 according to an embodiment may interrupt foreign substances that may be introduced through the at least one valley 70, through the above-described stepped lamination structure. For example, the FPCB 30 according to an embodiment may interrupt foreign substances that may be introduced through the at least one valley 70, through the adhesive layers 90 interposed between the plurality of layers 50. Because the stepped lamination structure is partially formed in some sections (e.g., the second lamination part 33) of the FPCB 30, the total thickness of the FPCB 30 may not be increased.

In an embodiment, foreign substances may be prevented from being introduced between the first surface 51a of the first layer 51 and the first member 61 because the FPCB 30 is pressed by the first sealing member 60 and/or the first waterproof member 81 surrounds the FPCB 30 to close the first accommodation hole 63. In addition, the first waterproof member 81 may be applied to a border of the first surface 51a of the first layer 51 and the first member 61, whereby introduction of foreign substances may be prevented.

In an embodiment, foreign substances may be prevented from being introduced between the eighth surface 54b of the fourth layer 54 and the second member 62 by surrounding the FPCB 30 such that the FPCB 30 is pressed by the first sealing member 60 and/or the first waterproof member 81 closes the first accommodation hole 63. In addition, the first waterproof member 81 may be applied to a border of the eighth surface 54b of the fourth layer 54 and the second member 62, whereby introduction of foreign substances may be prevented.

The electronic device 100 according to an embodiment may prevent foreign substances from being introduced between the plurality of layers 50 of the FPCB 30 while the shape of the FPCB 30 is maintained, through the above-described stepped lamination structure.

Figure 6A:
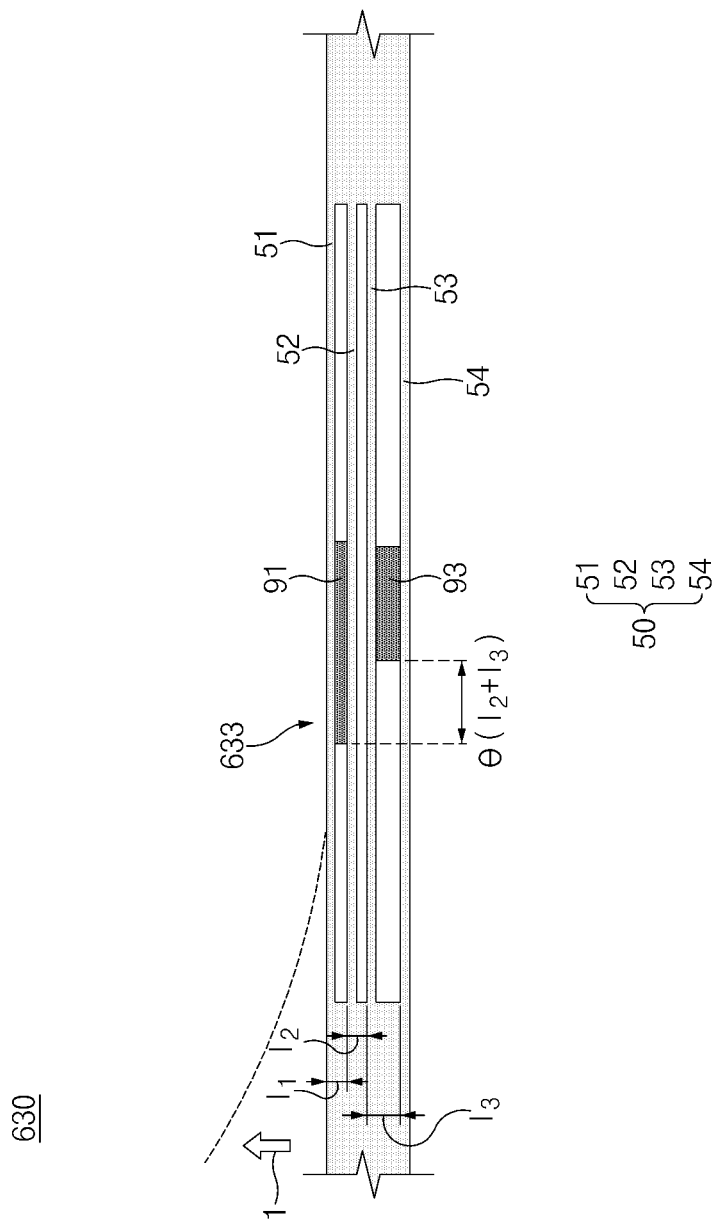
FIG. 6A illustrates an FPCB of an electronic device having a stepped lamination structure according to another embodiment.

FIG. 6A illustrates an FPCB of an electronic device having a stepped lamination structure according to another embodiment. In FIG. 6A, the FPCB in the flat state is illustrated for convenience of description. A direction 1 of FIG. 6A may refer to a direction, in which an FPCB 630 is to be curved.

Figure 6B:
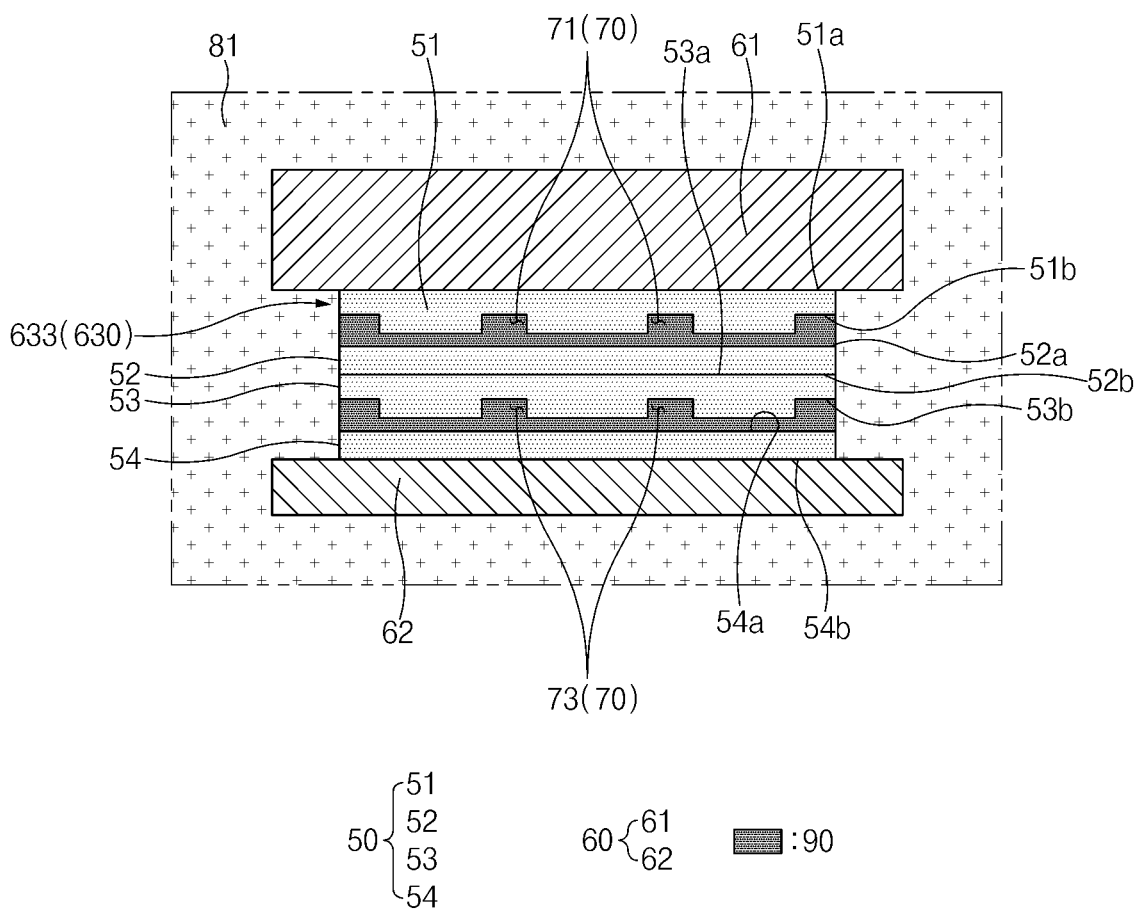
FIG. 6B is a view illustrating a stepped lamination structure of an FPCB according to another embodiment.

FIG. 6B is a view illustrating the stepped lamination structure of the FPCB according to another embodiment. FIG. 6B may be a cross-sectional view of the stepped lamination structure of the FPCB, taken in a direction that is perpendicular to a lengthwise direction. In FIG. 6B, the first member 61 and the second member 62 are illustrated together for convenience of description.

Referring to FIGS. 6A and 6B, the FPCB 630 of an electronic device 600 according to another embodiment may not include at least one valley (e.g., the second valley 72 of FIG. 5C) formed in the second layer 52. For example, at least one valley may not be formed on the third surface 52a and the fourth surface 52b of the second layer 52. In an embodiment, the third layer 53 may not include at least one valley that faces the second layer 52. For example, at least one valley may not be formed on the fifth surface 53a of the third layer 53. In this case, the second layer 52 may not be laminated on the third layer, in a second lamination part 633. The FPCB 630 according to an embodiment may not include an adhesive layer (e.g., the second adhesive layer 92 of FIG. 4) for laminating the second layer 52 on the third layer 53. In another embodiment, when the third layer 53 includes at least one valley formed on the fifth surface 53a, the second layer 52 may be laminated on the third layer 53 in the second lamination part 633 through the adhesive layer 90.

In an embodiment, the second layer 52 and the third layer 53 may be pressed by the first sealing member 60 and/or the first waterproof member 81, or a border between the second layer 52 and the third layer 53 may be sealed by an elastic force provided by the first sealing member 60 and/or the first waterproof member 81. Accordingly, even when the second layer 52 and the third layer 53 are not laminated on each other in the second lamination part 633, foreign substances may not be introduced between the second layer 52 and the third layer 53.

In an embodiment, the first layer 51 may include the first valley 71 that faces the second layer 52. For example, the first valley 71 may be formed on the second surface 51b of the first layer 51. In an embodiment, the second layer 52 may be laminated on the first layer 51 in the second lamination part 633 through the first adhesive layer 91. In an embodiment, the first adhesive layer 91 may be interposed between the first layer 51 and the second layer 52 to be filled at least in the first valley 71.

In an embodiment, a fourth difference value of the section lengths of the first layer 51 and the third layer 53, which correspond to the first curved part 32 may be represented by a product of the central angle $\theta$ and a sum of the second distance $l_2$ and the third distance $l_3$ ($\theta \times (l_2 + l_3)$). In an embodiment, the third layer 53 and the fourth layer 54 may be laminated on each other through the third adhesive layer 93. In an embodiment, an area, by which the first layer 51 and the second layer 52 are laminated on each other, and an area, by which the third layer 53 and the fourth layer 54 are laminated on each other, may be different. For example, the third layer 53 and the fourth layer 54 may be laminated on each other with an area that is at least smaller than an area, by which the first layer 51 and the second layer 52 are laminated on each other, by an area corresponding to the fourth difference value.

Figure 6C:
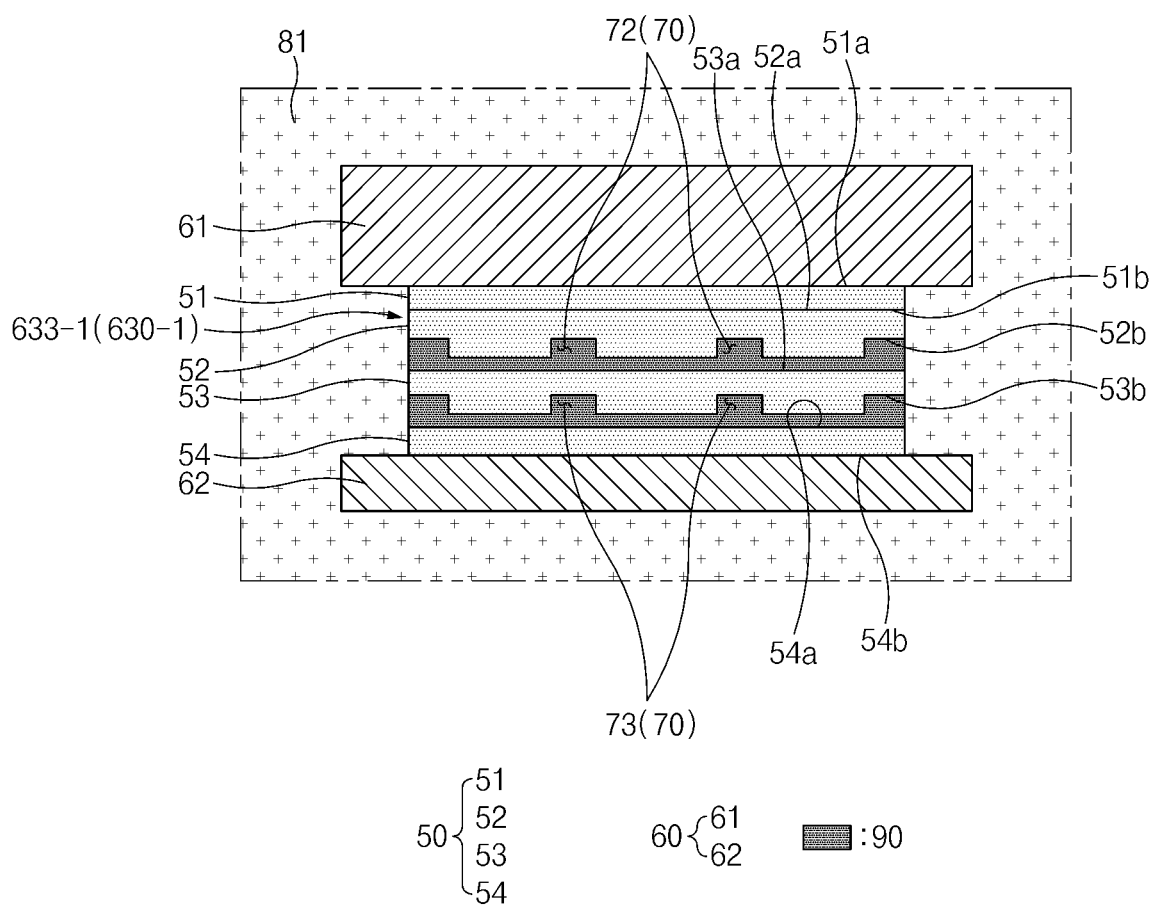
FIG. 6C is a view illustrating a stepped lamination structure of an FPCB according to another embodiment.

FIG. 6C is a view illustrating the stepped lamination structure of the FPCB according to another embodiment. FIG. 6C may be a cross-sectional view of the stepped lamination structure of the FPCB, taken in a direction that is perpendicular to a lengthwise direction. In FIG. 6C, the first member 61 and the second member 62 are illustrated together for convenience of description.

Referring to FIG. 6C, an FPCB 630-1 of an electronic device 600-1 according to another embodiment may not include at least one valley (e.g., the first valley of FIG. 5C) formed in the first layer 51. For example, at least one valley may not be formed on the first surface 51a and the second surface 51b of the first layer 51. In an embodiment, at least one valley may not be formed on the third surface 52a of the second layer 52, which faces the first layer 51. In this case, the first layer 51 and the second layer 52 may not be laminated on each other. The FPCB 630-1 according to an embodiment may not include an adhesive layer (e.g., the first adhesive layer 91 of FIG. 4) for laminating the first layer 51 and the second layer 52.

In an embodiment, the first layer 51 and the second layer 52 may be pressed by the first sealing member 60 and/or the first waterproof member 81. In an embodiment, a border of the first layer 51 and the second layer 52 may be sealed by an elastic force provided by the first sealing member 60 and/or the first waterproof member 81. Accordingly, even when the first layer 51 and the second layer 52 are not laminated on each other in a second lamination part 633-1, foreign substances may not be introduced between the first layer 51 and the second layer 52.

The FPCB 630-1 of the electronic device 600-1 according to an embodiment may not include at least one valley formed in the fourth layer 54. For example, at least one valley may not be formed on the seventh surface 54a and the eighth surface 54b of the fourth layer 54. In an embodiment, the third valley 73 may be formed on the sixth surface 53b of the third layer 53, which faces the fourth layer 54. In an embodiment, the third layer 53 and the fourth layer 54 may be laminated on each other through the adhesive layer 90. In an embodiment, the adhesive layer may be at least interposed between the third layer 53 and the fourth layer 54 to be filled in the third valley 73.

In an embodiment, in the second lamination part 633-1, an area, by which the second layer 52 and the third layer 53 are laminated on each other, and an area, by which the third layer 53 and the fourth layer 54 are laminated on each other, may be different. The above description of the stepped lamination structure may be applied to this in substantially the same, similar, or corresponding scheme.

In an embodiment, the first layer 51 and the fourth layer 54 that do not include the at least one valley and are located on an outermost one of the plurality of layers 50 of the FPCB 630-1 may include shielding layers. In an embodiment, the shielding layers may enhance a signal transmission performance of the FPCB 630-1 by shielding electromagnetic waves that may be delivered to (from) electronic components located around the FPCB 630-1. In an embodiment, the shielding layers include a film including the conductive metal layer, but the disclosure is not limited thereto.

Figure 6D:
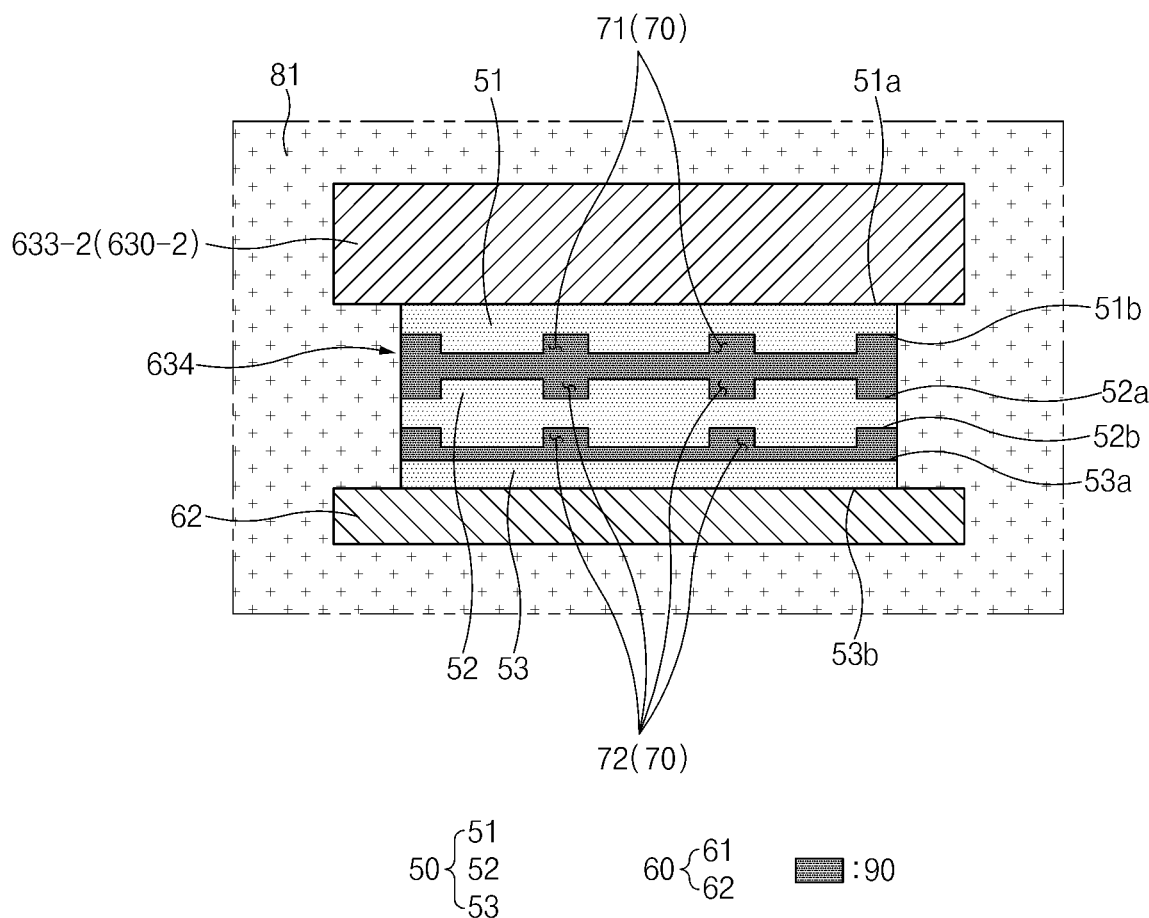
FIG. 6D is a view illustrating a stepped lamination structure of an FPCB according to another embodiment.

FIG. 6D is a view illustrating a stepped lamination structure of an FPCB according to another embodiment. FIG. 6D may be a cross-sectional view of the stepped lamination structure of the FPCB, taken in a direction that is perpendicular to a lengthwise direction. In FIG. 6D, the first member 61 and the second member 62 are illustrated together for convenience of description.

Referring to FIG. 6D, in an embodiment, the plurality of layers 50 of a FPCB 630-2 may include the first layer 51, the second layer 52, and the third layer 53. In an embodiment, the plurality of layers 50 of the FPCB 630-2 may not include the fourth layer (e.g., the fourth layer 54 of FIG. 4).

The FPCB 630-2 of the electronic device 600-2 according to an embodiment may include the first valley 71 formed in the first layer 51. The first valley 71 may be formed on the second surface 51b of the first layer 51.

The FPCB 630-2 according to an embodiment may include the second valley 72 formed in the second layer 52. In an embodiment, the second valley 72 may be formed on the third surface 52a and the fourth surface 52b of the second layer 52.

In an embodiment, the first layer 51 and the second layer 52 may be laminated on each other through the adhesive layer 90. For example, the first layer 51 and the second layer 52 may be laminated on each other, through the adhesive layers 90 that are interposed therebetween to be filled in the first valley 71 and the second valley 72 formed on the third surface 52a.

The FPCB 630-2 according to an embodiment may include at least one valley formed in the third layer 53. For example, at least one valley (e.g., the third valley 73 of FIG. 6C) may not be formed on the fifth surface 53a and the sixth surface 53b of the third layer 53.

In an embodiment, the first layer 51 and the second layer 52 may be laminated on each other through the adhesive layer 90. For example, the second layer 52 and the third layer 53 may be laminated on each other, through the adhesive layer 90 that is interposed therebetween to be filled in the second valley 72 formed on the fourth surface 52b.

In an embodiment, in the second lamination part 633-2, an area, by which the first layer 51 and the second layer 52 are laminated on each other, and an area, by which the second layer 52 and the third layer 53 are laminated on each other, may be different. The above description of the stepped lamination structure may be applied to this in substantially the same, similar, or corresponding scheme.

Figure 6E:
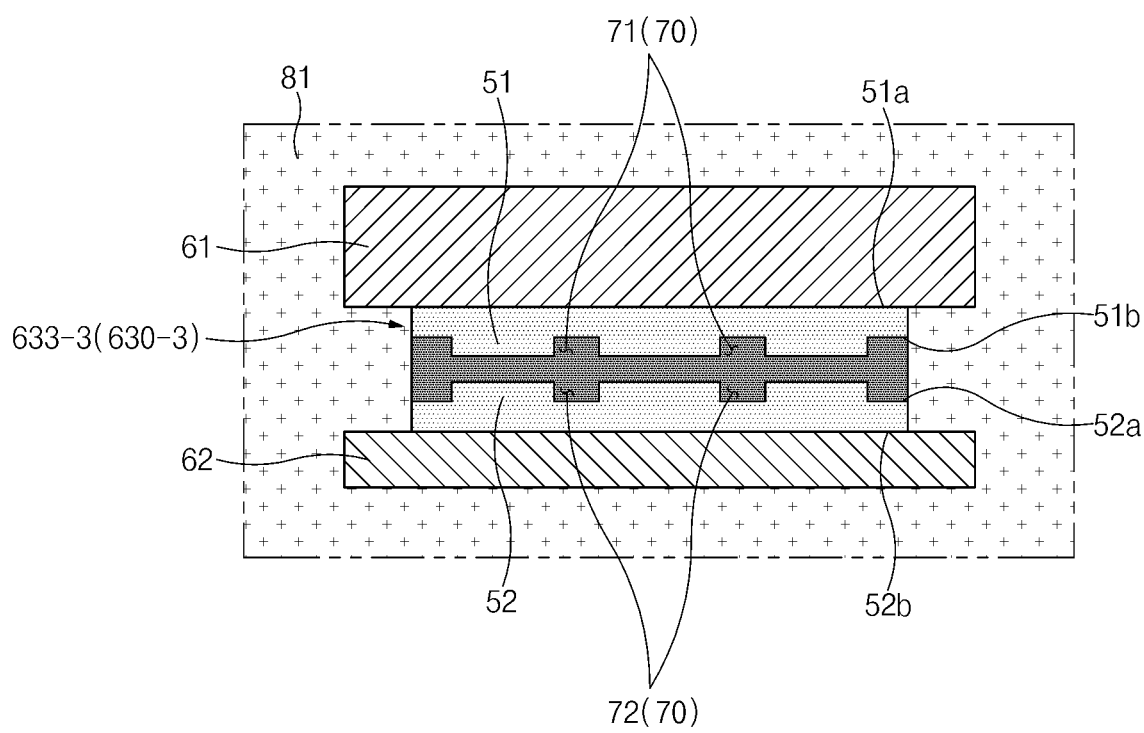
FIG. 6E is a view illustrating a stepped lamination structure of an FPCB according to another embodiment.

FIG. 6E is a view illustrating a stepped lamination structure of an FPCB according to another embodiment. FIG. 6E may be a cross-sectional view of the stepped lamination structure of the FPCB, taken in a direction that is perpendicular to a lengthwise direction. In FIG. 6E, the first member 61 and the second member 62 are illustrated together for convenience of description.

Referring to FIG. 6E, in an embodiment, the plurality of layers 50 of a FPCB 630-3 may include the first layer 51 and the second layer 52. In an embodiment, the plurality of layers 50 of the FPCB 630-3 may not include the third layer 53 (e.g., the fourth layer 54 of FIG. 4) and the fourth layer (e.g., the fourth layer 54 of FIG. 4).

The FPCB 630-3 of an electronic device 600-3 according to an embodiment may include the first valley 71 and the second valley 72 formed in the first layer 51 and the second layer 52, respectively. In an embodiment, the first valley 71 and the second valley 72 may be formed on facing surfaces of the first layer 51 and the second layer 52. For example, the first valley 71 may be formed on the second surface 51b of the first layer 51, and the second valley 72 may be formed on the third surface 52a of the second layer 52.

In an embodiment, in the second lamination part 633-3, the first layer 51 and the second layer 52 may be laminated on each other. For example, the first layer 51 and the second layer 52 may be laminated on each other through the adhesive layer 90. In an embodiment, the adhesive layer 90 may be interposed between the first layer 51 and the second layer 52. In an embodiment, the adhesive layer 90 may be filled in the first valley 71 and the second valley 72.

The FPCB of the electronic device according to various embodiments of the disclosure may include the plurality of layers. For example, the FPCB 30 of the electronic device 100 of FIG. 4 may include the plurality of layers 50 including the first to fourth layers 51 to 54. As another example, the FPCB 630-2 of the electronic device 600-2 of FIG. 6D may include the plurality of layers 50 including the first to third layers 51, 52, and 53. As another example, FPCB 630-3 of the electronic device 600-3 of FIG. 6E may include the plurality of layers 50 including the first and second layers 51 and 52.

The FPCB according to various embodiments of the disclosure may include at least one valley formed in at least one of the plurality of layers. For example, the FPCB 30 of the electronic device 100 of FIG. 5C may include the plurality of layers 53 including the first to fourth layers 51 to 52. As another example, the FPCB 630 of the electronic device 600 of FIG. 6B may include at least one valley 70 formed in the first layer 51 and the third layer 53, respectively. As another example, the FPCB 630-1 of the electronic device 600-1 of FIG. 6C may include at least one valley 70 formed in the second layer 52 and the third layer 53, respectively.

At least one of the plurality of layers of the FPCB 30 according to the disclosure may include at least one valley formed on one surface or opposite surfaces thereof. For example, the FPCB 30 of FIG. 5C may include at least one valley 70 (e.g., the first to third valleys 71 to 73) formed on surfaces (e.g., the second surface 51*b*, the fourth surface 52*b*, and the sixth surface 53*b*) of the first to third layers 51, 52, and 53. As another example, the FPCB 630-2 of FIG. 6D may include the second valleys 72 formed on opposite surfaces (e.g., the third surface 52 and the fourth surface 52*b*) of the second layer 52.

The FPCB of the electronic device according to various embodiments of the disclosure may include a part, in which at least two of the plurality of layers are laminated on each other in the second lamination part. For example, the FPCB 30 of FIG. 4 may include a part, in which the first to fourth layers 51 to 54 are laminated on each other in the second lamination part 33. As another example, the FPCB 630-1 of FIG. 6C may include a part, in which the second layer 52, the third layer 53, and the fourth layer 54 are laminated on each other in the second lamination part 633-1. As another example, the FPCB 630-3 of FIG. 6E may include a part, in which the first layer 51 and the second layer 52 are laminated on each other in the second lamination part 633-3.

The FPCB according to an embodiment of the disclosure may include a part, in which at least three of the plurality of layers are separated from each other in the second lamination part 33. For example, the FPCB 30 of FIG. 4 may include a part, in which, among the plurality of layers 50, the first to fourth layers 51 to 54 are laminated on each other in the third section 33*a* of the second lamination part 33. As another example, the FPCB 630-2 of FIG. 6D may include a part, in which, among the plurality of layers 50, the first to third layers 51, 52, and 53 are separated from each other in the second lamination part 633-2.

Figure 7A:
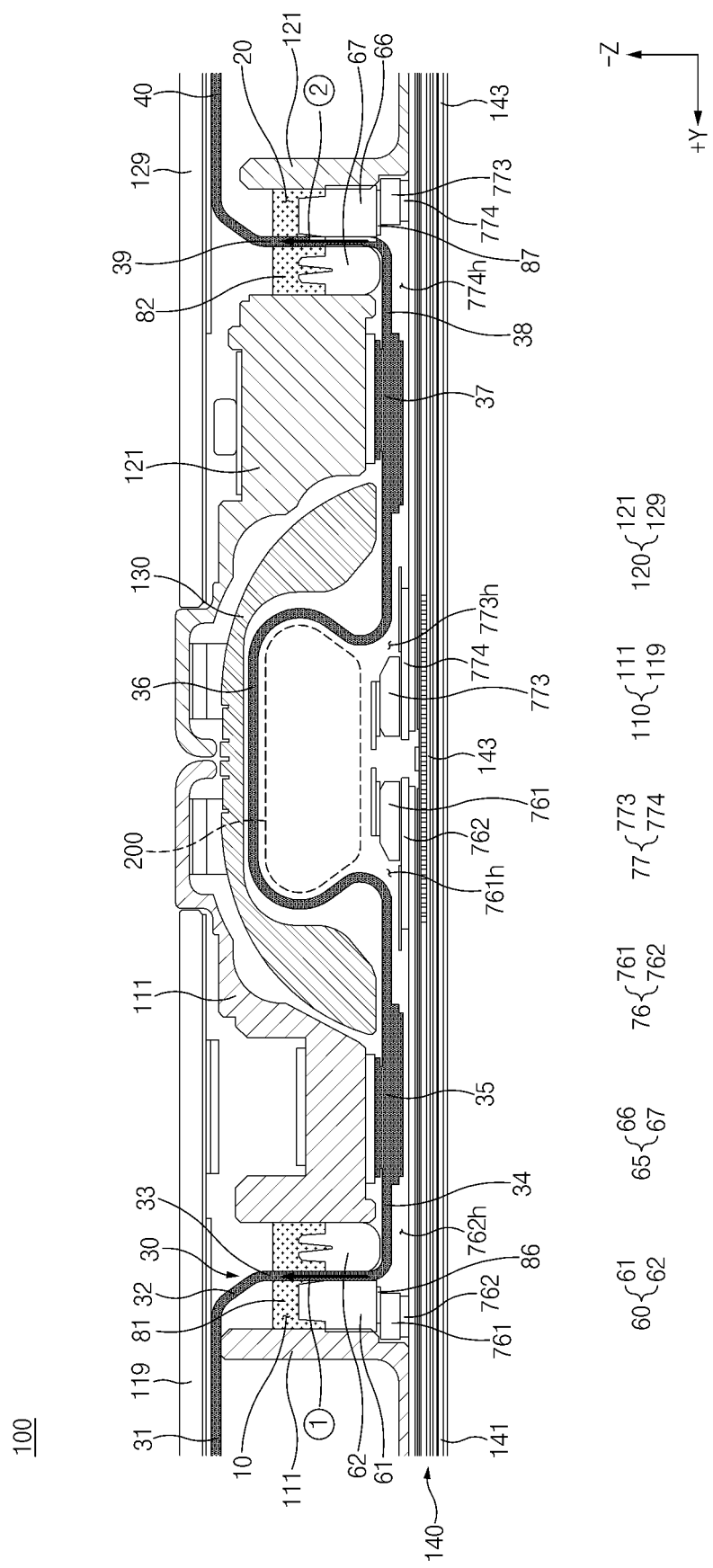
FIG. 7A illustrates an electronic device in a flat state according to an embodiment.

FIG. 7A illustrates an electronic device in a flat state according to an embodiment.

Figure 7B:
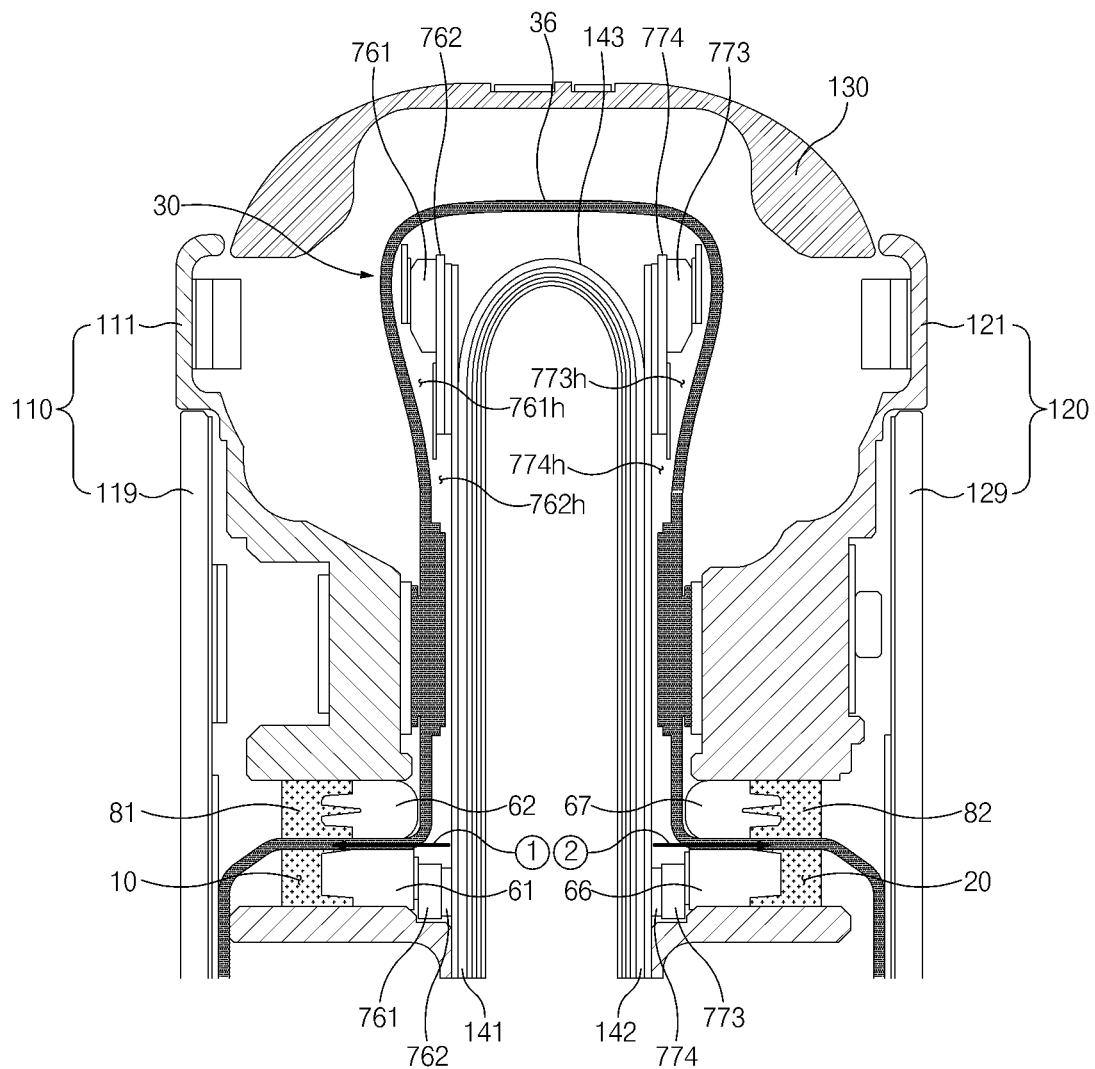
FIG. 7B illustrates an electronic device in a fully folded state according to an embodiment.

FIG. 7B illustrates an electronic device in a fully folded state according to an embodiment.

Figure 7C:
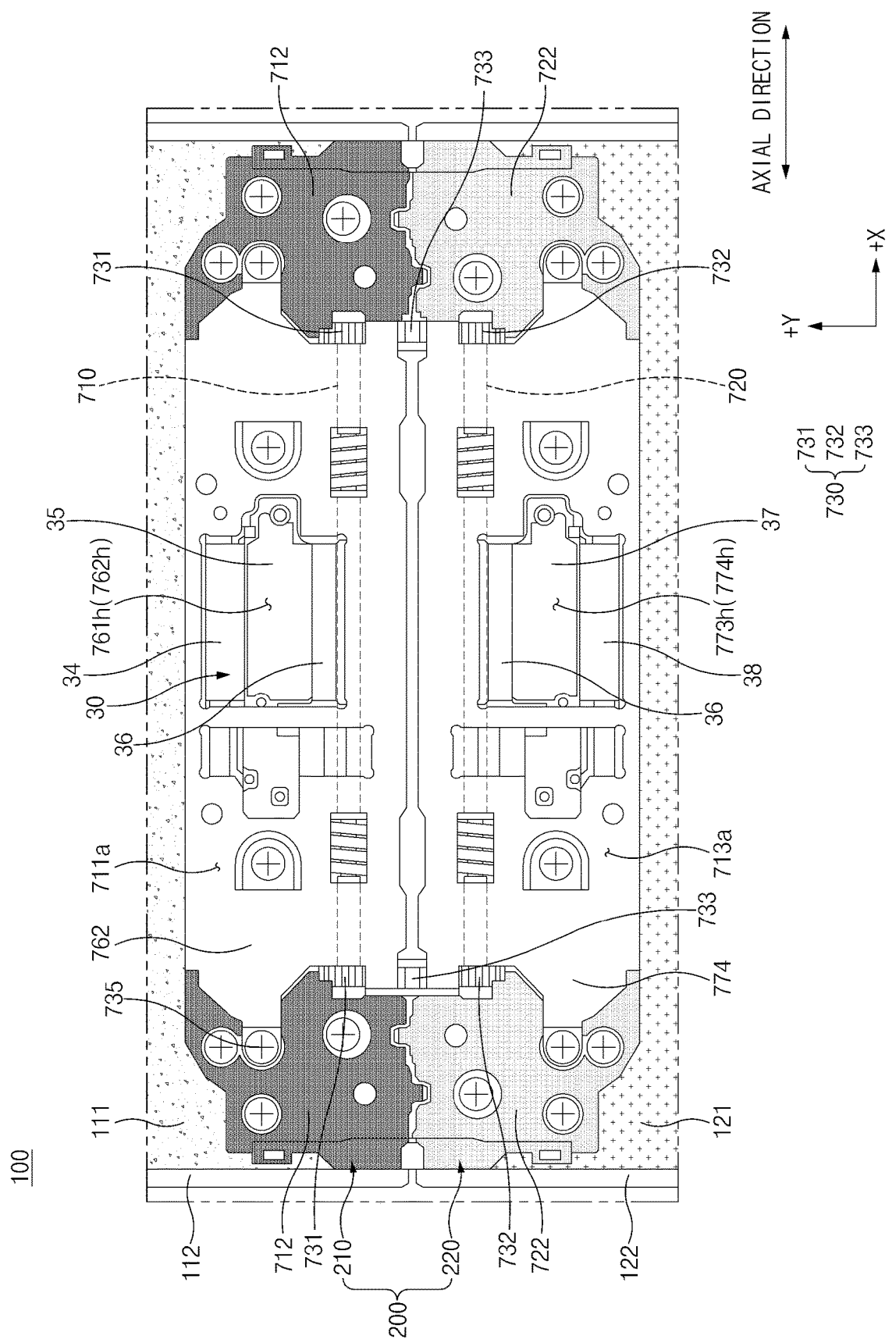
FIG. 7C is a view illustrating an electronic device in a direction that faces a hinge structure in a flat state.

FIG. 7C is a view illustrating an electronic device in a direction that faces a hinge structure in a flat state.

Referring to FIGS. 7A, 7B, and 7C, the electronic device 100 according to an embodiment may include the second sealing member 65, a second waterproof member 82, a second adhesive member 87, and a second plate structure 77. In an embodiment, the description provided with reference to the first sealing member 60, the first waterproof member 81, the first adhesive member 86, and the first plate structure 76 may be applied to the second sealing member 65, the second waterproof member 82, the second adhesive member 87, and the second plate structure 77 in substantially the same, similar, or corresponding scheme. For example, the second sealing member 65 may be disposed in the second through-hole 20 formed in the second support member 121. The second sealing member 65 may include the third member 66 and the fourth member 67. A portion of the FPCB 30 that passes through the second through-hole 20 may be surrounded by the second sealing member 65 and/or the second waterproof member 82. The second waterproof member 82 may be disposed on the second sealing member 65, in the second through-hole 20. The second waterproof member 82 may be formed to surround a fifth lamination part 39 of the FPCB 30 that extends over the second sealing member 65 in the second through-hole 20. The second adhesive member 87 may partially bond the second plate structure 77 and the second sealing member 65. The second plate structure 77 may be disposed between the second support member 121 and the display 140. The second plate structure 77 may include a third plate 773 that partially contacts the third member 66, and a fourth plate 774 disposed between the third plate 773 and the display 140.

The FPCB 30 according to an embodiment may include a folding part 36, a fourth lamination part 37, a third curved part 38, the fifth lamination part 39, and a fourth curved part 40.

In an embodiment, the folding part 36 may extend from the third lamination part 35 to the fourth lamination part 37. For example, the folding part 36 may extend from the third lamination part 35 to the fourth lamination part 37 over the hinge housing 130 (or the hinge structure 200). In an embodiment, the folding part 36 may be located between the hinge housing 130 and the display 140. In an embodiment, the folding part 36 may be configured to be curved at least partially, and may be deformed according to a folding operation of the electronic device 100.

In an embodiment, the descriptions corresponding to the third lamination part 35, the second curved part 34, the second lamination part 33, and the first curved part 32 may be applied to the fourth lamination part 37, the third curved part 38, the fifth lamination part 39, and the fourth curved part 40 in substantially the same, similar, or corresponding scheme. For example, the fourth curved part 40 may include a section, in which the plurality of layers 50 are curved, and may extend from a point between the second rear plate 129 and the second support member 121 to the second through-hole 20. The fifth lamination part 39 may extend from the fourth curved part 40 to the second sealing member 65 in the second through-hole 20. In an embodiment, the stepped lamination structure provided in the second lamination part 33 also may be provided in the fifth lamination part 39. Through the stepped lamination structure provided in the second lamination part 33 and the fifth lamination part 39, foreign substances that may be introduced through paths (e.g., a first path ① and a second path ②) between the plurality of layers 50 of the FPCB 30 may be interrupted. The third curved part 38 may extend from the fifth lamination part 39 to an outside of the second through-hole 20. For example, the third curved part 38 may extend from the fifth lamination part 39 to a point between the second support member 121 and the second area 142 of the display 140. The fourth lamination part 37 may extend from the third curved part 38 to the folding part 36, and may be at least partially supported by the second support member 121.

In an embodiment, the FPCB 30 may be disposed to partially overlap a hole formed in the first plate structure 76. For example, a first hole 761*h* and a second hole 762*h* that at least partially overlap each other (or are at least partially aligned with each other) may be formed in the first plate 761 and the second plate 762. The second curved part 34, the third lamination part 35, and the folding part 36 of the FPCB 30 may partially overlap the first hole 761*h* and the second hole 762*h*. In an embodiment, the FPCB 30 may be at least partially located in the first hole 761h and the second hole 762h (e.g., the third lamination part 35 and/or the second curved part 34), but the disclosure is not limited thereto.

In an embodiment, the first hole 761h and the second hole 762h may provide a space, in which the second curved part 34 of the FPCB 30 extends into the first through-hole 10 to be curved. In an embodiment, the first hole 761h and the second hole 762h may define a space that prevents the second curved part 34 from contacting the display 140 when the second curved part 34 is abnormally curved due to the folding operation of the electronic device 100 or a defect in a process of forming the FPCB 30.

In an embodiment, the FPCB 30 may be disposed to partially overlap a hole formed in the second plate structure 77. For example, a third hole 773h and a fourth hole 774h that at least partially overlap each other (or are at least partially aligned with each other) may be formed in the third plate 773 and the fourth plate 774. The fourth lamination part 37, the third curved part 38, and the folding part 36 of the FPCB 30 may partially overlap the third hole 773h and the fourth hole 774h. In an embodiment, the FPCB 30 may be at least partially located in the third hole 773h and the fourth hole 774h (e.g., the fourth lamination part 37 and/or the third curved part 38), but the disclosure is not limited thereto.

In an embodiment, the third hole 773h and the fourth hole 774h may define a space, in which the third curved part 38 of the FPCB 30 extends into the second through-hole 20 to be curved. In an embodiment, the third hole 773h and the fourth hole 774h may define a space that prevents the third curved part 38 from contacting the display 140 when the third curved part 38 is abnormally curved due to the folding operation of the electronic device 100 or a defect in a process of forming the FPCB 30.

Referring to FIG. 7C together with FIGS. 7A and 7B, the hinge structure 200 according to an embodiment may include the first rotation structure 210, the second rotation structure 220, and a gear structure 730. In an embodiment, the hinge structure 200 may be at least partially disposed in an interior space provided by the hinge housing 130.

In an embodiment, the first rotation structure 210 may include a first shaft 710, a first rotation arm 712, and the first plate structure 76.

In an embodiment, the first shaft 710 may extend long along an axial direction thereof. In an embodiment, the first rotation arm 712 may be connected to the first shaft 710. In an embodiment, the first rotation arm 712 may be configured to rotate together with the first shaft 710 or alone independently from the first shaft 710. In an embodiment, the first rotation arms 712 may be provided at opposite ends of the first shaft 710, and the first plate structure 76 may be disposed therebetween. The first plate structure 76 may be coupled to the first rotation arm 712, and may be rotated together with the first rotation arm 712. For example, the first plate structure 76 may be fixedly coupled to the first rotation arm 712 through a fixing member, such as a screw 735.

In an embodiment, the first rotation arm 712 may be connected to the first housing 110 (not shown in FIG. 7C). For example, the first support member 111 of the first housing 110 may be coupled to the first rotation arm 712 through a coupling member (e.g., the screw 735). In an embodiment, the first housing 110 may be rotatable through the first rotation arm 712.

In an embodiment, the first rotation structure 210 may include the second plate 762 of the first plate structure 76, and a first support surface 711a formed by the first rotation arm 712. In an embodiment, the first support surface 711a may be formed to be substantially flat, and may support the display 140 disposed thereon.

In an embodiment, the second rotation structure 220 may include a second shaft 720, a second rotation arm 722, and the second plate structure 77.

In an embodiment, the second shaft 720 may extend long along an axial direction thereof. For example, the second shaft 720 may be spaced apart from the first shaft 710, and may extend substantially in parallel to the first shaft 710. In an embodiment, the second rotation arm 722 may be connected to the second shaft 720. In an embodiment, the second rotation arm 722 may be configured to rotate together with the second shaft 720 or alone independently from the first shaft 720. In an embodiment, the second rotation arms 722 may be provided at opposite ends of the second shaft 720, and the second plate structure 77 may be disposed therebetween. The second plate structure 77 may be coupled to the second rotation arm 722, and may be rotated together with the second rotation arm 722.

In an embodiment, the second rotation arm 722 may be connected to the second housing 120 (not shown in FIG. 7C). For example, the second support member 121 of the second housing 120 may be coupled to the second rotation arm 722. In an embodiment, the second housing 120 may be rotatable through the second rotation arm 722.

In an embodiment, the second rotation structure 220 may include the fourth plate 774 of the second plate structure 77, and a second support surface 713a formed by the second rotation arm 722. In an embodiment, the second support surface 713a may be formed to be substantially flat, and may support the display 140 disposed thereon. In an embodiment, when the electronic device 100 is in the flat state, the first support surface 711a and the second support surface 713a may define one substantially flat surface, and a partial area (e.g., the folding area 143) of the display 140 disposed on the first support surface 711a and the second support surface 713a may be maintained in a substantially flat state.

Although it has been described that the electronic device according to various embodiments of the disclosure is of a foldable type that allows a folding operation, the disclosure is not limited thereto. For example, the electronic device may include an electronic device of a bar type or an electronic device that does not support a folding operation. As another example, the electronic device may include a slidable electronic device, of which a screen display area of a display may be expanded or contracted through a sliding operation. The stepped lamination structure of the FPCB according to various embodiments of the disclosure also may be applied to case, in which the FPCB of the electronic device of the above-described various form passes through a through-hole provided in a support member or the like and the FPCB includes a part that is curved with respect to the through-hole.

Figure 8A:
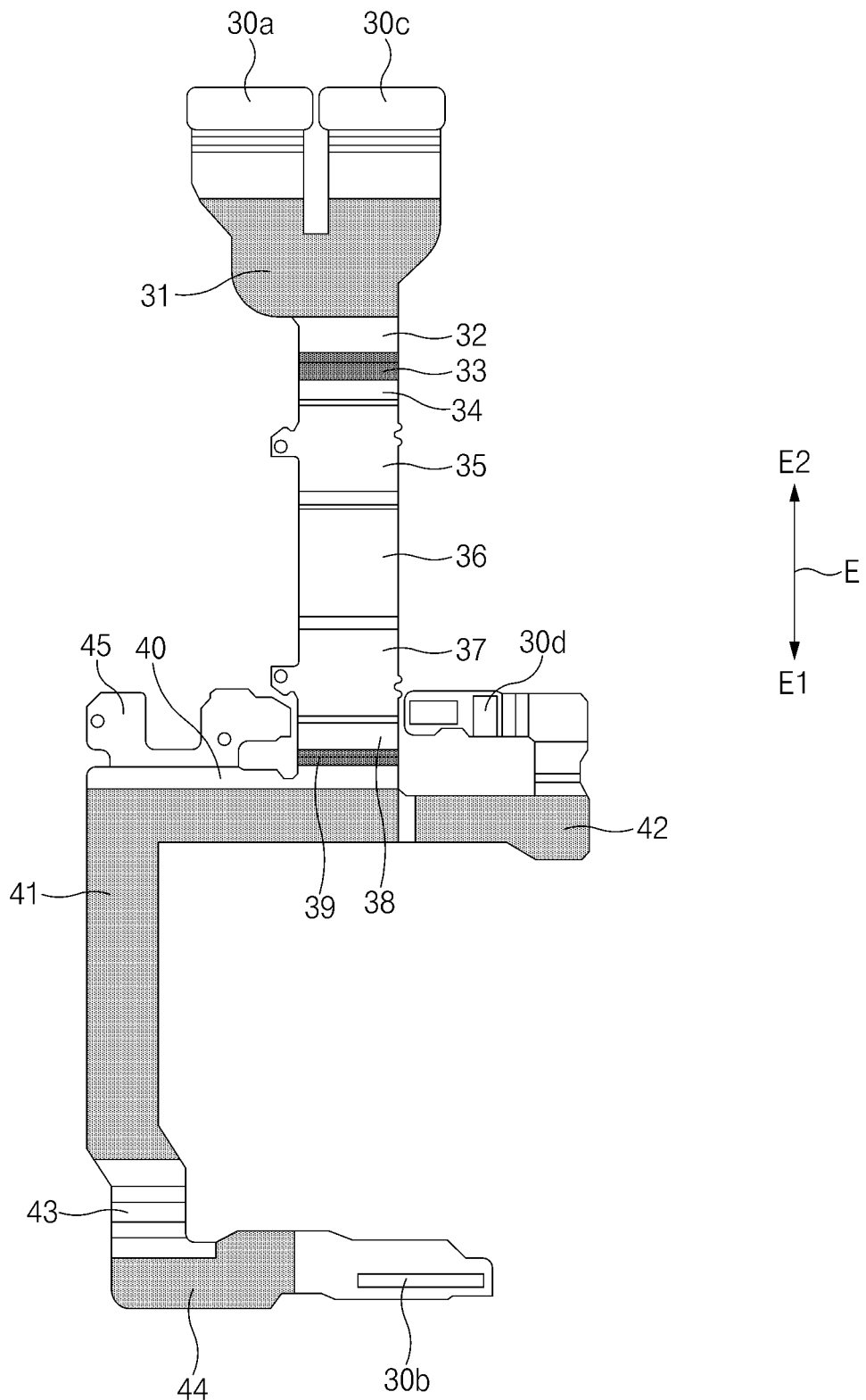
FIG. 8A illustrates an FPCB according to an embodiment.

FIG. 8A illustrates the FPCB 30 according to an embodiment. In FIG. 8A, an extension direction "E" may be defined. For example, the extension direction "E" may be a direction that is substantially perpendicular to an axial direction of the electronic device 100. As another example, the extension direction "E" may be a lengthwise direction of the second lamination part 33 (or the fifth lamination part 39) of the FPCB 30. As another example, the extension direction "E" may be a direction that is substantially the same as the extension direction of the second lamination part 33 (or the fifth lamination part 39) of the FPCB 30. The extension direction "E" may include a first extension direction E1 and a second extension direction E2. The first extension direction E1, for example, may be a direction that faces the first housing (e.g., the first housing 110 of FIG. 3C) from the second housing (e.g., the second housing 120 of FIG. 3C). As another example, the first extension direction E1 may be a direction that faces the second connector part 30*b* from the first connector part 30*a* of the FPCB 30. The second extension direction E2 may be a direction that is opposite to the first extension direction E1.

Referring to FIG. 8A, the first lamination part 31 according to an embodiment may include at least some of two parts that extend after being branched in the second extension direction E2, and the first connector part 30*a* and the third connector part 30*c* may extend from the two parts.

In an embodiment, the fourth curved part 40 may extend from the fifth lamination part 39 in a direction that is different from an extension direction of the fifth lamination part 39. For example, the fourth curved part 40 may extend from the fifth lamination part 39 in a direction that is substantially perpendicular to the extension direction "E".

The FPCB 30 according to an embodiment may include a fixed part 45, a sixth lamination part 41, a seventh lamination part 42, a connection part 43, and an eighth lamination part 44.

In an embodiment, the fixed part 45 may extend from the fourth curved part 40 in the second extension direction E2. In an embodiment, the fixed part 45 may be connected and fixed to the second support member (e.g., the second support member 121 of FIG. 3C) of the second housing (e.g., the second housing 120 of FIG. 3C).

In an embodiment, the sixth lamination part 41 may extend from the fourth curved part 40 and toward the connection part 43. For example, the sixth lamination part 41 may include a first part that extends from the fourth curved part 40 in the first extension direction E1 with a first width, and a second part that extends from the first part in the first extension direction E1 with a second width that is smaller than the first width. In an embodiment, the second part of the sixth lamination part 41 may be longer than the first part with respect to the extension direction "E", but the disclosure is not limited thereto.

In an embodiment, portions of the at least two layers of the plurality of layers 50 (see FIG. 8B) corresponding to the sixth lamination part 41 may be laminated on each other. For example, when the plurality of layers 50 include the first to fifth layers, the fourth layer and the fifth layer may be laminated on each other, but the disclosure is not limited to the above-described example.

In an embodiment, the seventh lamination part 42 may extend from the sixth lamination part 41. For example, the seventh lamination part 42 may extend from one side (e.g., a right side of the sixth lamination part 41 with reference to the illustration of FIG. 8A) of the first part of the sixth lamination part 41 in a direction (e.g., the axial direction) that is substantially perpendicular to the extension direction "E".

In an embodiment, portions of at least two layers of the plurality of layers 50 corresponding to the seventh lamination part 42 may be laminated on each other. For example, when the plurality of layers 50 include the first to fifth layers, the first layer and the second layer of the seventh lamination part 42 may be laminated on each other, but the disclosure is not limited to the above-described example.

In an embodiment, the fourth connector part 30*d* may extend from the seventh lamination part 42.

In an embodiment, the connection part 43 may extend from the sixth lamination part 41 to the eighth lamination part 44. In an embodiment, the connection part 43 may include a part that extends to be inclined with respect to the extension direction "E" in the flat state of the FPCB 30, and a part that extends along the first extension direction E1. In an embodiment, the connection part 43 may be formed to be at least partially curved. For example, the portions of the plurality of layers 50 corresponding to the connection part 43 may not be laminated on each other.

In an embodiment, the eighth lamination part 44 may extend from the connection part 43 in a direction (e.g., the axial direction) that is substantially perpendicular to the extension direction "E". In an embodiment, at least two layers of the plurality of layers corresponding to the eighth lamination part 44 may be laminated on each other. For example, all the layers of the plurality of layers corresponding to the eighth lamination part 44 may be laminated on each other, but the disclosure is not limited to the above-described example. In an embodiment, the eighth lamination part 44 may be formed to be at least partially rigid, but the disclosure is not limited to the above-described example. In an embodiment, the second connector part 30*b* may extend from the eighth lamination part 44 (e.g., in a direction that is perpendicular to the extension direction "E").

In an embodiment, the parts (e.g., the first lamination part 31, the first curved part 32, the second curved part 34, the folding part 36, the third curved part 38, and the like) that extend from the second lamination part 33 and the fifth lamination part 39 of the FPCB 30 have been described with respect to the extension direction "E", but the shape of the FPCB 30 is not limited to the illustrated embodiment, and various design modifications may be made as long as an ordinary person in the art may easily make the modifications.

Figure 8B:
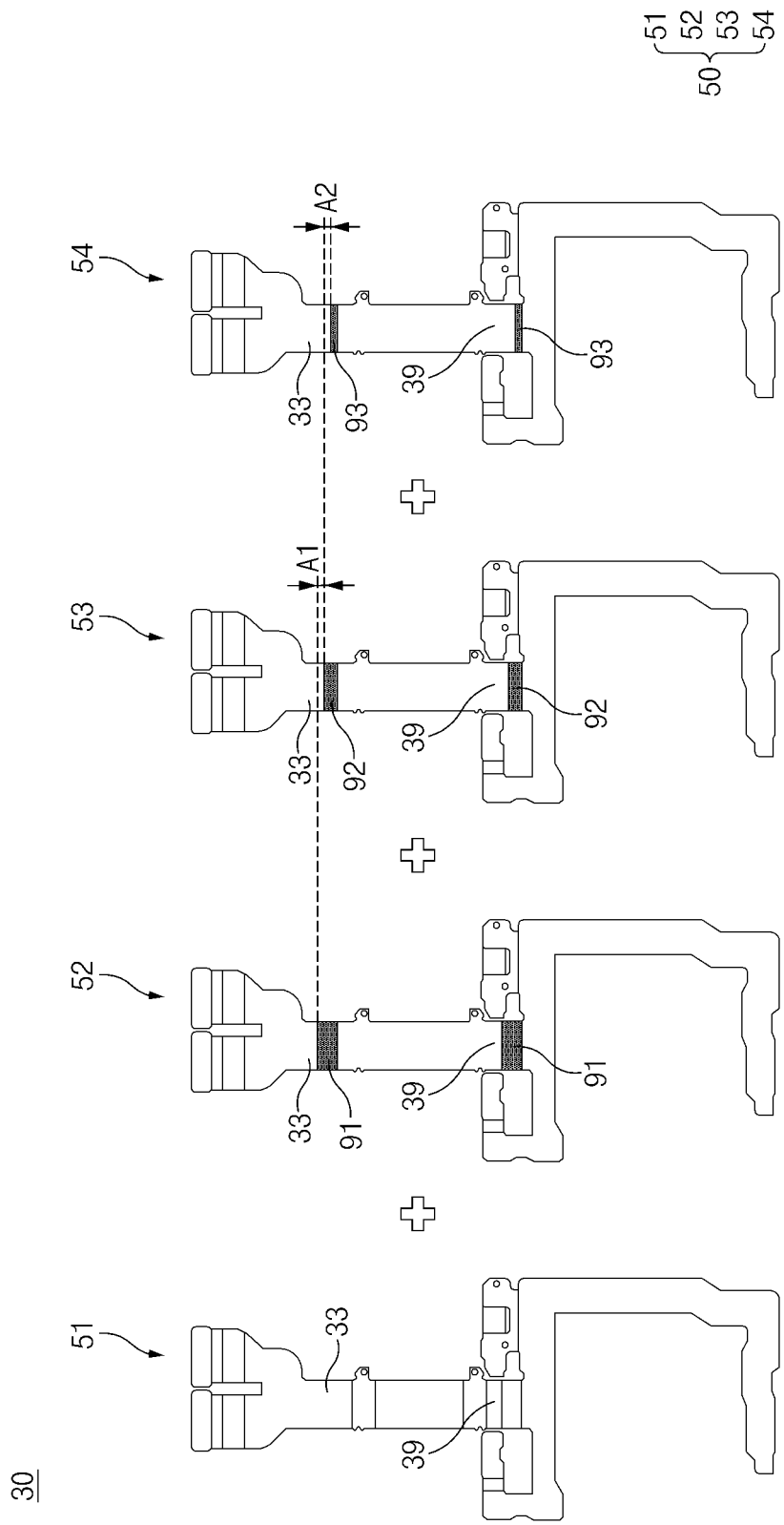
FIG. 8B is a view illustrating a method for laminating a plurality of layers of an FPCB according to an embodiment.

FIG. 8B is a view illustrating a method for laminating a plurality of layers (e.g., layers 51, 52, 53 and 54) of an FPCB according to an embodiment. Referring to FIG. 8B, a first layer 51 may be provided first, and a first adhesive layer 91 may be applied to the second lamination part 33 and the fifth lamination part 39 of the second layer 52. The second layer 52, to which the first adhesive layer 91 is applied, may be laminated onto the first layer 51. In an embodiment, the second adhesive layer 92 may be applied to the second lamination part 33 and the fifth lamination part 39 of the third layer 53. In an embodiment, the second adhesive layer 92 may be applied to the second lamination part 33 and the fifth lamination part 39 with an area that is smaller than that of the first adhesive layer 91 by the first area A1. In an embodiment, the third layer 53, to which the second adhesive layer 92 is applied, may be laminated on the second layer 52. In an embodiment, the third adhesive layer 93 may be applied to the second lamination part 33 and the fifth lamination part 39 of the fourth layer 54. In an embodiment, the third adhesive layer 93 may be applied to the second lamination part 33 and the fifth lamination part 39 with an area that is smaller than that of the second adhesive layer 92 by the second area A2. In an embodiment, the fourth layer 54, to which the third adhesive layer 93 is applied, may be laminated on the third layer 53.

In an embodiment, after the first to fourth layers 51 to 54 are laminated, the applied first to third adhesive layers 91 to 93 may be cured.

In an embodiment, although it is described that differences between the areas of the first to third adhesive layers 91 to 93 applied to the second lamination part 33, and the areas of the first to third adhesive layers 91 to 93 applied to the fifth lamination part 39 are the same, the disclosure is not limited thereto.

For example, the second adhesive layer 92 applied to the fifth lamination part 39 of the third layer 53 may be applied with an area that is smaller than that of the first adhesive layer 91 applied to the fifth lamination part 39 of the second layer 52 by a third area. The third area may be different from the first area A1. As another example, the third adhesive layer 93 applied to the fifth lamination part 39 of the fourth layer 54 may be applied with an area that is smaller than that of the second adhesive layer 92 applied to the fifth lamination part 39 of the third layer 53 by a fourth area. The fourth area may be different from the second area A2.

Figure 9A:
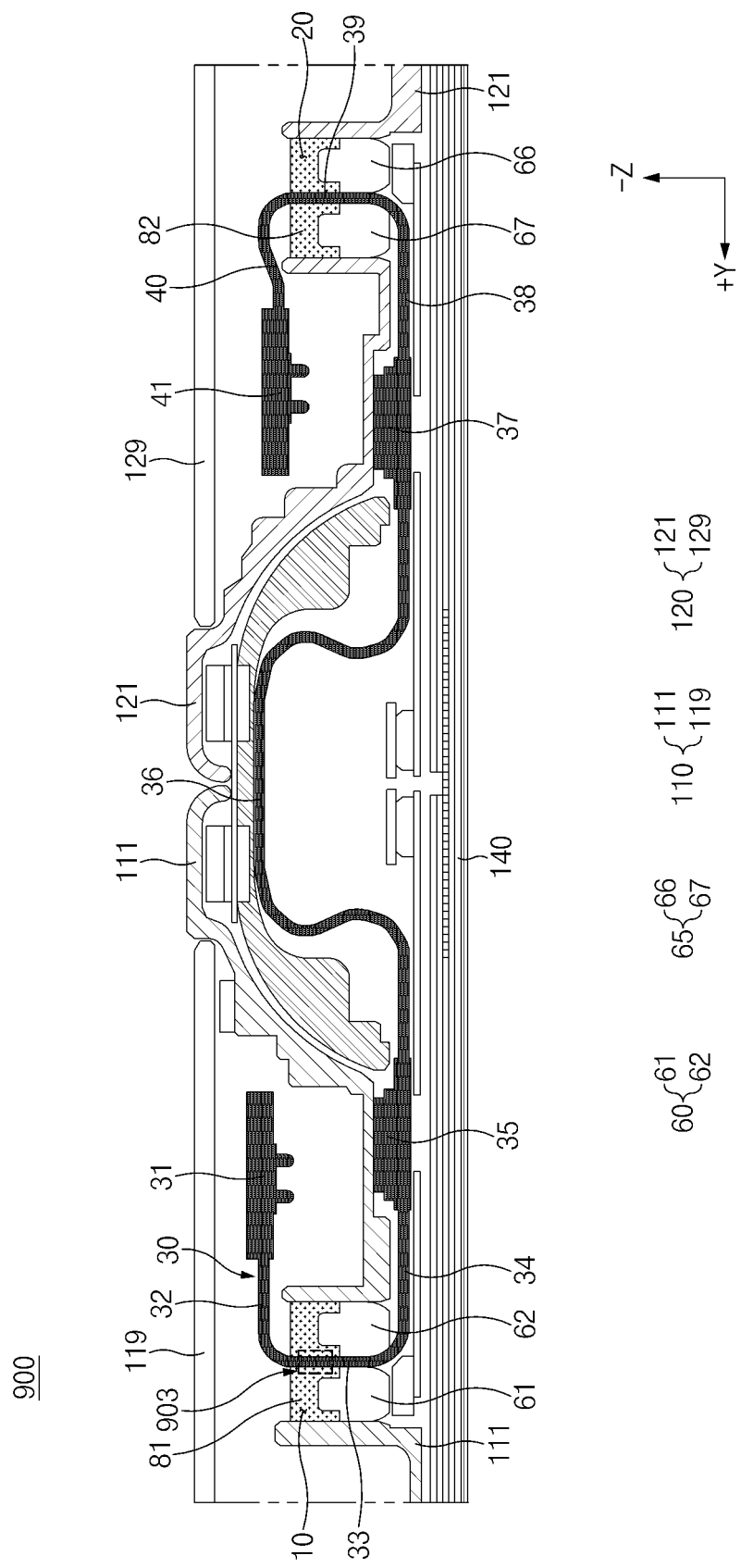
FIG. 9A illustrates an electronic device according to an embodiment.

FIG. 9A illustrates an electronic device according to an embodiment. In FIG. 9A, the illustration of configurations (e.g., the first connector part 30a and the third connector part 30c of FIG. 8A) that extend from the first lamination part 31 of the FPCB 30, except for the first curved part 32, are omitted for convenience of description. Furthermore, in FIG. 9A, the illustration of other configurations (e.g., the connection part 43, the eighth lamination part 44, and the second connector part 30b of FIG. 8A) that extend from the sixth lamination part 41 is omitted for convenience of description.

Figure 9B:
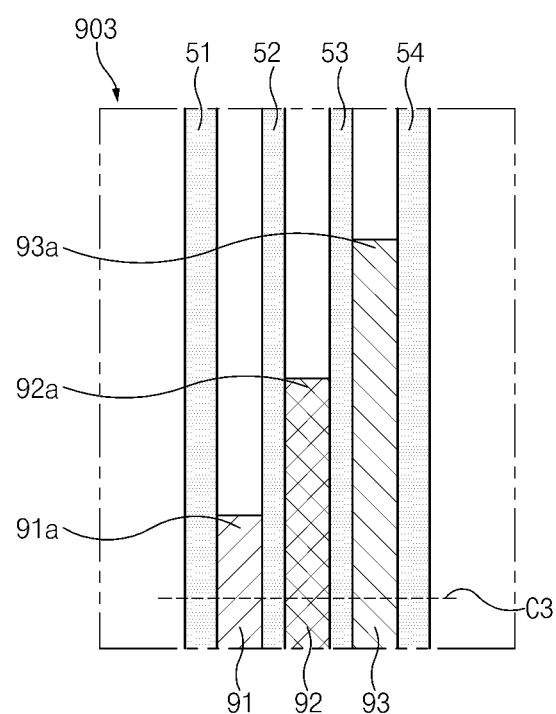
FIG. 9B illustrates a second lamination part corresponding to an area of FIG. 9A.

FIG. 9B illustrates the second lamination part corresponding to an area 903 of FIG. 9A.

Hereinafter, a repeated description of configurations having the same reference numerals as the above-described configurations will be omitted.

Referring to FIG. 9A, an electronic device 900 (e.g., the electronic device 100 of FIG. 7A) according to another embodiment may include the FPCB 30. The first lamination part 31 of the FPCB 30, unlike the illustration of FIG. 7A, may be located between the first through-hole 10 and the second housing 120. The first curved part 32 may extend from the first lamination part 31 in a direction that becomes farther away from the second housing 120. The first curved part 32 may extend from the first lamination part 31 to the first through-hole 10. The second lamination part 33 may extend from the first curved part 32 in the first through-hole 10. The first curved part 32 and the second lamination part 33, unlike the illustration of FIG. 7A, may include a part that is curved in a counterclockwise direction with respect to a direction that extends from the first lamination part 31.

Because the curving direction of the second lamination part 33 is different, the stepped lamination structure of the second lamination part 33 may be configured in opposite to that illustrated in FIG. 5. For example, referring to FIG. 9B, the first layer 51 and the second layer 52 of the second lamination part 33 may be laminated on each other by the first adhesive layer 91 interposed therebetween. The second layer 52 and the third layer 53 may be laminated on each other through the second adhesive layer 92 interposed therebetween. The third layer 53 and the fourth layer 54 may be laminated on each other through the third adhesive layer 93 interposed therebetween. The first end 91a of the first adhesive layer 91 may be closer to line C3 than the second end 92a. For example, the first end 91a of the first adhesive layer 91 may be closer to line C3 than the second end 92a by a third difference value ($\Delta d_3$ of FIG. 5B). The second end 92a of the second adhesive layer 92 may be closer to line C3 than the third end 93a. For example, the second end 92a of the second adhesive layer 92 may be closer to line C3 than the third end 93a by a second difference value ($\Delta d_2$ of FIG. 5B). Line C3 may be an arbitrary reference line that passes through all of the first adhesive layer 91, the second adhesive layer 92, and the third adhesive layer 93, in a direction that is perpendicular to the extension direction of the second lamination part 33.

The sixth lamination part 41 of the FPCB 30, unlike the illustration of FIG. 7A, may be located between the second through-hole 20 and the first housing 110. The fourth curved part 40 may extend from the sixth lamination part 41 in a direction that becomes farther away from the first housing 110. The fourth curved part 40 may extend from the sixth lamination part 41 to the second through-hole 20. The fifth lamination part 39 may extend from the fourth curved part 40 in the second through-hole 20. The fourth curved part 40 and the fifth lamination part 39, unlike the illustration of FIG. 7A, may include a part that is curved in a clockwise direction with respect to a direction that extends from the sixth lamination part 41. Because the curving direction of the fifth lamination part 39 is different, the stepped lamination structure of the fifth lamination part 39 may be configured in opposite to the stepped lamination structure of the fifth lamination part 39. For example, the stepped lamination structure of the fifth lamination part 39 may be substantially the same as or similar to the stepped lamination structure illustrated in FIG. 5B.

The electronic device (e.g., the electronic device 100 of FIG. 4) according to an embodiment may include a first housing (e.g., the first housing 110 of FIG. 4) including a first through-hole (e.g., the first through-hole 10 of FIG. 4), of which a first opening (e.g., the first opening 11 of FIG. 4) and a second opening (e.g., the second opening 12 of FIG. 4) are communicated with each other, a second housing (e.g., the second housing 120 of FIG. 3A) connected to the first housing to be rotatable, an FPCB (e.g., the FPCB 30 of FIG. 4) extending from the first housing to the second housing via the first through-hole and including a plurality of layers (e.g., the plurality of layers 50 of FIG. 4), and a first sealing member (e.g., the first sealing member 60 of FIG. 4) disposed in the first through-hole and surrounding the FPCB, the FPCB may include a first lamination part (e.g., the first lamination part 31 of FIG. 4) extending in the first housing in a direction that may be different from an extension direction of the first through-hole, and including a part, in which the plurality of layers are at least partially laminated on each other, a first curved part (e.g., the first curved part 32 of FIG. 4) extending from the first lamination part to pass through the first opening, and including a part, in which the plurality of layers are separated from each other, a second lamination part (e.g., the second lamination part 33 of FIG. 4) extending from the first curved part toward the first sealing member, and a second curved part (e.g., the second curved part 34 of FIG. 4) extending from the second lamination part toward the second housing via the second opening, the plurality of layers may include a first layer (e.g., the first layer 51 of FIG. 40 and a second layer (e.g., the second layer 52 of FIG. 4), a portion of the first layer and/or the second layer corresponding to the second lamination part may include at least one first valley (e.g., the first valley 71 of FIG. 5C) extending from a surface that faces an adjacent layer in a lengthwise direction of the FPCB, and the second lamination part may include a first adhesive layer (e.g., the first adhesive layer 91 of FIG. 5B) interposed between the first layer and the second layer to be filled in the at least one first valley.

In an embodiment, the plurality of layers may include a third layer (e.g., the third layer 53 of FIG. 4), and the second layer may be located between the first layer and the third layer, a portion of the second layer and/or the third layer corresponding to the second lamination part may include at least one second valley extending from a surface that faces an adjacent layer in the lengthwise direction of the FPCB, the second lamination part may include a second adhesive layer (e.g., the second valley 72 of FIG. 5C) interposed between the second layer and the third layer to be filled in the at least one second valley, and an area of the first adhesive layer may be different from an area of the second adhesive layer.

In an embodiment, a portion of the first layer corresponding to the first curved part may be curved to have a radius that is smaller than that of a portion of the second layer corresponding to the first curved part, the portion of the second layer corresponding to the first curved part may be curved to have a radius that is smaller than that of a portion of the third layer corresponding to the first curved part, the first adhesive layer may include a first end (e.g., the first end 91a of FIG. 5B) that faces the first opening, the second adhesive layer may include a second end (e.g., the second end 92a of FIG. 5B) that faces the first opening, and the first end may be closer to the first opening than the second end.

In an embodiment, the plurality of layers may include a fourth layer (e.g., the fourth layer 54 of FIG. 4), and the third layer 53 may be located between the second layer 52 and the fourth layer 54, and a portion of the third layer 53 and/or the fourth layer 54 corresponding to the second lamination part may include at least one third valley (e.g., the third valley 73 of FIG. 5C) extending from a surface that extends from a surface that faces an adjacent layer in a lengthwise direction of the FPCB, the second lamination part may include a third adhesive layer (e.g., the third adhesive layer 93 of FIG. 4) interposed between the third layer 53 and the fourth layer 54 to be filled in the at least one third valley, and an area of the third adhesive layer 93 may be different from an area of the second adhesive layer 92.

In an embodiment, the portion of the third layer 53 corresponding to the first curved part may be curved to have a radius that is smaller than that of a portion of the fourth layer 54 corresponding to the first curved part, the third adhesive layer 93 may include a third end (e.g., the third end 93a of FIG. 5B) that faces the first opening, and the second end may be closer to the first opening than the third end.

In an embodiment, the at least one first valley may be formed only in the second layer 52, the at least one third valley may be formed only in the third layer 53, the first layer 51 and the fourth layer 54 may be located on outermost sides of the plurality of layers, and the first layer 51 and the fourth layer 54 may be shielding layers including a conductive metal layer.

In an embodiment, the second lamination part may include a first section (e.g., the third section 33a of FIG. 4), and a second section (e.g., the fourth section 33b of FIG. 4) extending from the first section toward the first sealing member, the first end of the first adhesive layer, the second end of the second adhesive layer, and the third end of the third adhesive layer may be located in the first section, and portions of the first adhesive layer, the second adhesive layer, and the third adhesive layer corresponding to the first section may extend to the second section.

In an embodiment, the first sealing member 60 may include a first member (e.g., the first member 61 of FIG. 4) and a second member (e.g., the second member 62 of FIG. 4) that surrounds the FPCB together, and the second section of the second lamination part may extend to a point between the first member and the second member.

In an embodiment, the first housing 110 may include a first support member (e.g., the first support member 111 of FIG. 4) having the first through-hole, and a first rear plate (e.g., the first rear plate 119 of FIG. 4) coupled to the first support member, the first opening of the first through-hole may be located between the first rear plate and the second opening, and the first curved part may extend into the first through-hole, between the first rear plate and the first support member.

In an embodiment, the first opening of the first through-hole may be substantially parallel to the first rear plate.

In an embodiment, the first layer and/or the second layer having the at least one first valley may include a base layer (e.g., the base layer 503 of FIG. 5C), and transmission lines (e.g., the transmission lines 505 of FIG. 5C) formed on the base layer, and the at least one first valley may be defined as the transmission lines are spaced apart from each other on the base layer.

In an embodiment, the electronic device 100 may include a first waterproof member (e.g., the first waterproof member 81 of FIG. 4) disposed on the first sealing member to at least partially surround the second lamination part.

In an embodiment, the electronic device 100 may include a first printed circuit board (e.g., the first printed circuit board 151 of FIG. 1) disposed in the first housing and a second printed circuit board (e.g., the second printed circuit board 152 of FIG. 1) disposed in the second housing, and the first printed circuit board and the second printed circuit board may be electrically connected to each other through the FPCB.

In an embodiment, the electronic device 100 may include a second sealing member (e.g., the second sealing member 65 of FIG. 7A) and a second waterproof member (e.g., the second waterproof member 82 of FIG. 7A), the second housing may include a second through-hole (e.g., the second through-hole 20 of FIG. 7A) extending in a direction that is different from the first lamination part, the plurality of layers of the FPCB may pass through the second through-hole, and the second sealing member may be disposed in the second through-hole to surround the FPCB, the FPCB may include a third lamination part (e.g., the fifth lamination part 39 of FIG. 7A) located in the second through-hole to be adjacent to the second sealing member, the second waterproof member may be disposed in the second through-hole to at least partially surround the third lamination part, and a portion of the first layer and/or the third layer corresponding to the third lamination part may include at least one second valley extending from a surface that faces an adjacent layer in the lengthwise direction of the FPCB, and the third lamination part may include a second adhesive layer interposed between the first layer and the second layer to be filled in the at least one second valley.

The foldable electronic device (e.g., the electronic device 100 of FIG. 4) according to an embodiment may include a first housing (e.g., the first housing 110 of FIG. 4) including a first through-hole (e.g., the first through-hole 10 of FIG. 4), of which a first opening (e.g., the first opening 11 of FIG. 4) and a second opening (e.g., the second opening 12 of FIG. 4) are communicated with each other, a second housing (e.g., the second housing 120 of FIG. 3A) connected to the first housing to be rotatable, an FPCB (e.g., the FPCB 30 of FIG. 4) extending from the first housing to the second housing via the first through-hole and including a plurality of layers, a first sealing member (e.g., the first sealing member 60 of FIG. 4) disposed in the first through-hole to surround the FPCB, and that provides an elastic force in a direction that faces an inner wall (e.g., the inner surface 13 of FIG. 4) of the first through-hole and a direction that faces the FPCB, and a first waterproof member (e.g., the first waterproof member 81 of FIG. 4) located in the first through-hole and formed on the first sealing member to surround the FPCB, the FPCB may include a first curved part (e.g., the first curved part 32 of FIG. 4) extending from an outside of the first through-hole to an interior of the first through-hole via the first opening, wherein the first curved part includes a section (e.g., the second section 32b of FIG. 4) curved from a first point (e.g., the boarder S1 of FIG. 5A) on an outer side of the first opening to a second point (e.g., the start point S2 of FIG. 5A) in an interior of the first through-hole, a first lamination part (e.g., the second lamination part 33 of FIG. 4) including a first section (e.g., the third section 33a of FIG. 4) extending from the first curved part, and a second section (e.g., the fourth section 33b of FIG. 4) extending from the first section toward the first sealing member, the plurality of layers include a first layer (e.g., the first layer 51 of FIG. 4), a second layer (e.g., the second layer 52 of FIG. 4) laminated on the first layer, and a third layer (e.g., the third layer 53 of FIG. 4) laminated on the second layer, the first layer includes at least one first valley (e.g., the first valley 71 of FIG. 5C) formed on a surface that faces the second layer, the second layer includes at least one second valley (e.g., the second valley 72 of FIG. 5C) formed on a surface that faces the third layer, the first lamination part includes a first adhesive layer (e.g., the first adhesive layer 91 of FIG. 4) interposed between the first layer and the second layer to be filled in the at least one first valley, and a second adhesive layer (e.g., the second adhesive layer 92 of FIG. 4) interposed between the second layer and the third layer to be filled in the at least one second valley, and a portion of the second adhesive layer corresponding to the first section may have an extent that is smaller than that of the first adhesive layer by a first area (e.g., the first area A1 of FIG. 4), and the first area may be defined based on a central angle (e.g., the central angle θ of FIG. 5A) formed by the first point and the second point with respect to a curvature center of the curved section of the first curved part, and a spacing distance (e.g., the second distance $l_2$ of FIG. 5A) between the second layer and the third layer.

In an embodiment, the first area A1 may be defined by a product of the central angle θ and the spacing distance (e.g., the second distance $l_2$).

Figure 10:
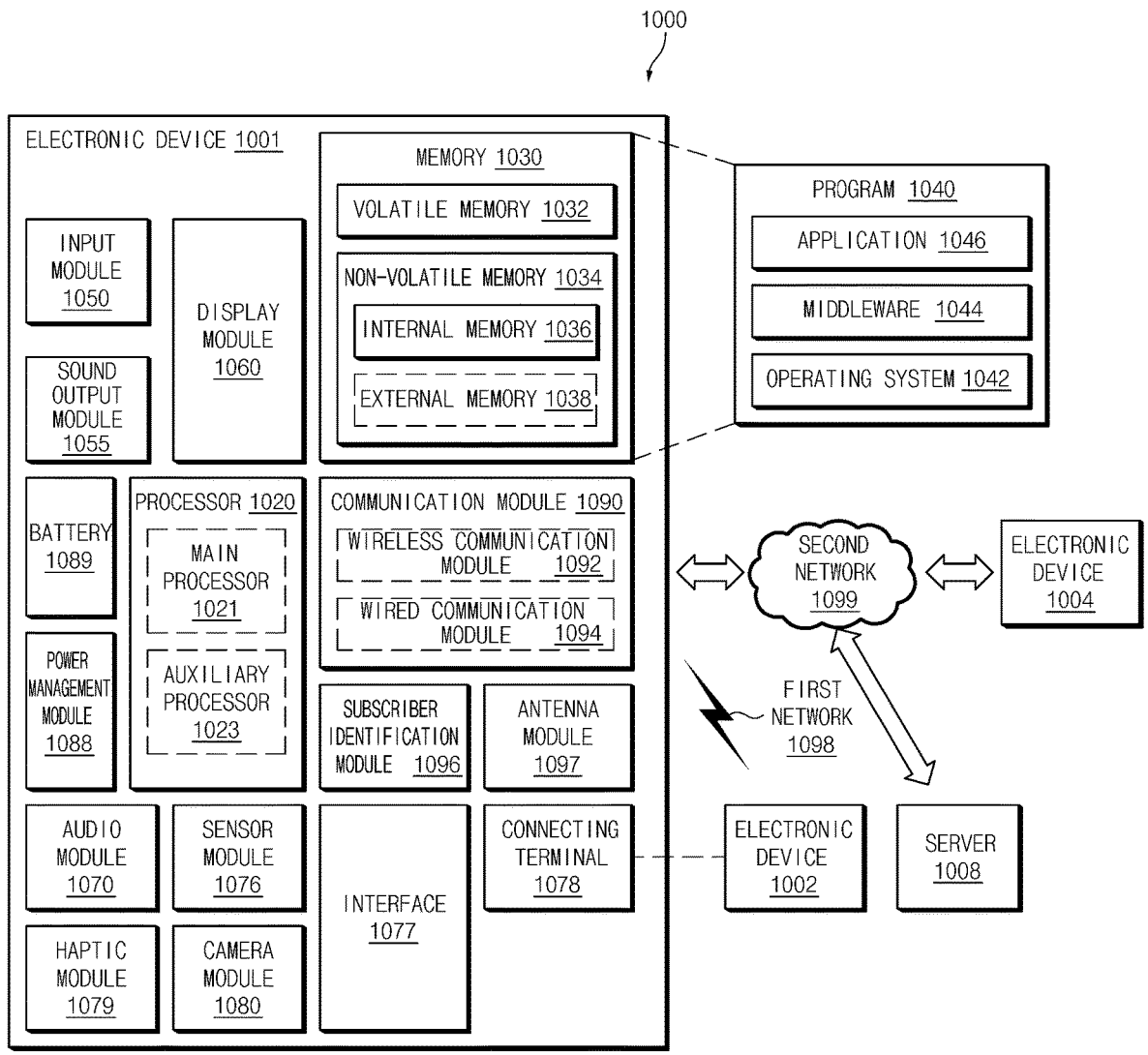
FIG. 10 illustrates an electronic device in a network environment according to various embodiments.

FIG. 10 is a block diagram illustrating an electronic device 1001 in a network environment 1000 according to various embodiments. Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In some embodiments, at least one of the components (e.g., the connecting terminal 1078) may be omitted from the electronic device 1001, or one or more other components may be added in the electronic device 1001. In some embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thererto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beam-forming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 1064 dB or less) for implementing mMTC, or U-plane latency (e.g., 0.5 ms or less for each of downlink (DL) and uplink (UL), or a round trip of 10 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In another embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a first housing including a first through-hole, of which a first opening and a second opening are communicated with each other;
   a second housing rotatably connected to the first housing;
   a flexible printed circuit board (FPCB) extending from the first housing to the second housing via the first through-hole and including a plurality of layers; and
   a first sealing member disposed in the first through-hole and surrounding the FPCB,
   wherein the FPCB includes:
   a first lamination part extending in the first housing in a direction that is different from an extension direction of the first through-hole, and including a part, in which the plurality of layers are at least partially laminated on each other;
   a first curved part extending from the first lamination part to pass through the first opening, and including a part, in which the plurality of layers are separated from each other;
   a second lamination part extending from the first curved part toward the first sealing member; and
   a second curved part extending from the second lamination part toward the second housing via the second opening,
   wherein the plurality of layers include a first layer and a second layer,
   wherein a portion of the first layer and/or the second layer corresponding to the second lamination part includes at least one first valley extending from a surface that faces an adjacent layer in a lengthwise direction of the FPCB, and
   wherein the second lamination part includes a first adhesive layer interposed between the first layer and the second layer to be filled in the at least one first valley.

2. The electronic device of claim 1, wherein the plurality of layers include a third layer, and the second layer is located between the first layer and the third layer,
   wherein a portion of the second layer and/or the third layer corresponding to the second lamination part includes at least one second valley extending from a surface that faces an adjacent layer in the lengthwise direction of the FPCB,
   wherein the second lamination part includes a second adhesive layer interposed between the second layer and the third layer to be filled in the at least one second valley, and
   wherein an area of the first adhesive layer is different from an area of the second adhesive layer.

3. The electronic device of claim 2, wherein a portion of the first layer corresponding to the first curved part is curved to have a radius that is smaller than that of a portion of the second layer corresponding to the first curved part,
   wherein the portion of the second layer corresponding to the first curved part is curved to have a radius that is smaller than that of a portion of the third layer corresponding to the first curved part,
   wherein the first adhesive layer includes a first end that faces the first opening,
   wherein the second adhesive layer includes a second end that faces the first opening, and
   wherein the first end is closer to the first opening than the second end.

4. The electronic device of claim 3, wherein the plurality of layers include a fourth layer, and the third layer is located between the second layer and the fourth layer,
   wherein the third layer and/or the fourth layer corresponding to the second lamination part includes at least one third valley extending from a surface that faces an adjacent layer in the lengthwise direction of the FPCB,
   wherein the second lamination part includes a third adhesive layer interposed between the third layer and the fourth layer to be filled in the at least one third valley, and
   wherein an area of the third adhesive layer is different from the area of the second adhesive layer.

5. The electronic device of claim 4, wherein the portion of the third layer corresponding to the first curved part is curved to have a radius that is smaller than that of a portion of the fourth layer corresponding to the first curved part, wherein the third adhesive layer includes a third end that faces the first opening, and wherein the second end is closer to the first opening than the third end.

6. The electronic device of claim 5, wherein the at least one first valley is formed only in the second layer, wherein the at least one third valley is formed only in the third layer, wherein the first layer and the fourth layer are located on outermost sides of the plurality of layers, and wherein the first layer and the fourth layer are shielding layers including a conductive metal layer.

7. The electronic device of claim 5, wherein the second lamination part includes a first section, and a second section extending from the first section toward the first sealing member, wherein the first end of the first adhesive layer, the second end of the second adhesive layer, and the third end of the third adhesive layer are located in the first section, and wherein portions of the first adhesive layer, the second adhesive layer, and the third adhesive layer corresponding to the first section extend to the second section.

8. The electronic device of claim 7, wherein the first sealing member includes a first member and a second member configured to surround the FPCB together, and wherein the second section of the second lamination part extends to a point between the first member and the second member.

9. The electronic device of claim 5, wherein the first housing includes a first support member having the first through-hole, and a first rear plate coupled to the first support member, wherein the first opening of the first through-hole is located between the first rear plate and the second opening, and wherein the first curved part extend into the first through-hole, between the first rear plate and the first support member.

10. The electronic device of claim 9, wherein the first opening of the first through-hole is substantially parallel to the first rear plate.

11. The electronic device of claim 1, wherein the first layer and/or the second layer having the at least one first valley includes a base layer, and transmission lines formed on the base layer, and wherein the at least one first valley is defined as the transmission lines are spaced apart from each other on the base layer.

12. The electronic device of claim 1, comprising:

a first waterproof member disposed on the first sealing member to at least partially surround the second lamination part.

13. The electronic device of claim 1, comprising:

a first printed circuit board disposed in the first housing and a second printed circuit board disposed in the second housing, wherein the first printed circuit board and the second printed circuit board are electrically connected to each other through the FPCB.

14. The electronic device of claim 13, comprising:

a second sealing member and a second waterproof member, wherein the second housing includes a second through-hole extending in a direction that is different from the first lamination part, wherein the plurality of layers of the FPCB pass through the second through-hole, wherein the second sealing member is disposed in the second through-hole to surround the FPCB, wherein the FPCB includes a third lamination part located in the second through-hole to be adjacent to the second sealing member, wherein the second waterproof member is disposed in the second through-hole to at least partially surround the third lamination part, wherein a portion of the first layer and/or the third layer corresponding to the third lamination part includes at least one second valley extending from a surface that faces an adjacent layer in the lengthwise direction of the FPCB, and wherein the third lamination part includes a second adhesive layer interposed between the first layer and the second layer to be filled in the at least one second valley.

* * * * *